US007855363B2

(12) United States Patent
Miyai et al.

(10) Patent No.: US 7,855,363 B2
(45) Date of Patent: Dec. 21, 2010

(54) INSPECTION METHOD AND APPARATUS USING AN ELECTRON BEAM

(75) Inventors: Hiroshi Miyai, Hitachi (JP); Ryuichi Funatsu, Hitachinaka (JP); Taku Ninomiya, Hitachinaka (JP); Yasuhiko Nara, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 205 days.

(21) Appl. No.: 12/222,606

(22) Filed: Aug. 12, 2008

(65) Prior Publication Data

US 2009/0045338 A1    Feb. 19, 2009

Related U.S. Application Data

(63) Continuation of application No. 11/354,247, filed on Feb. 15, 2006, now Pat. No. 7,425,704, which is a continuation of application No. 10/669,253, filed on Sep. 25, 2003, now Pat. No. 7,034,298.

(30) Foreign Application Priority Data

Sep. 26, 2002   (JP) .............................. 2002-280142

(51) Int. Cl.
*G01N 23/225* (2006.01)
(52) U.S. Cl. ...................... 250/310; 250/306; 250/307; 250/311
(58) Field of Classification Search ................. 250/306, 250/307, 310, 311
See application file for complete search history.

(56) References Cited

U.S. PATENT DOCUMENTS

| 5,038,048 | A | 8/1991 | Maeda et al. |
| 5,051,585 | A | 9/1991 | Koshishiba et al. |
| 5,173,719 | A | 12/1992 | Taniguchi et al. |
| 5,512,747 | A | 4/1996 | Maeda |
| 6,172,363 | B1 | 1/2001 | Shinada et al. |
| 6,329,826 | B1 | 12/2001 | Shinada et al. |
| 6,583,634 | B1 | 6/2003 | Nozoe et al. |
| 6,700,122 | B2 | 3/2004 | Matsui et al. |
| 6,703,850 | B2 | 3/2004 | Nozoe et al. |
| 6,744,266 | B2 | 6/2004 | Dor et al. |
| 6,852,973 | B2 | 2/2005 | Suzuki et al. |

(Continued)

FOREIGN PATENT DOCUMENTS

JP    7-201946    8/1995

(Continued)

*Primary Examiner*—Jack I Berman
*Assistant Examiner*—Michael Maskell
(74) *Attorney, Agent, or Firm*—Dickstein Shapiro LLP

(57) ABSTRACT

An inspection method and apparatus irradiates a sample on which a pattern is formed with an electron beam, so that an inspection image and a reference image can be generated on the basis of a secondary electron or a reflected electron emitted by the sample. An abnormal pattern is determined based on a difference in halftone values of each pixel between the inspection image and the reference image. A plurality of feature quantities of the abnormal pattern are obtained from an image of the abnormal pattern, and, based on the distribution of the plurality of feature quantities of the abnormal pattern, a range for classifying the type of the abnormal pattern is designated. Thus, a desired defect can be extracted from many defects extracted by inspection.

11 Claims, 16 Drawing Sheets

U.S. PATENT DOCUMENTS

| | | |
|---|---|---|
| 2001/0033683 A1* | 10/2001 | Tanaka et al. ............... 382/149 |
| 2002/0028399 A1 | 3/2002 | Nakasuji et al. |
| 2002/0080347 A1 | 6/2002 | Yoda et al. |
| 2002/0168787 A1 | 11/2002 | Noguchi et al. |
| 2003/0015659 A1 | 1/2003 | Honda et al. |
| 2004/0021074 A1 | 2/2004 | Suzuki et al. |
| 2004/0188609 A1 | 9/2004 | Miyai et al. |
| 2006/0108527 A1* | 5/2006 | Fujita et al. ................. 250/310 |

FOREIGN PATENT DOCUMENTS

| | | |
|---|---|---|
| JP | 11-160402 | 6/1999 |
| JP | 2001-331784 | 11/2001 |

* cited by examiner

FEATURE QUANTITY
DISTRIBUTION CHART

DEFECT IMAGE

FEATURE QUANTITY DISTRIBUTION CHART

DEFECT IMAGE

FIG.9 A
FEATURE QUANTITY
DISTRIBUTION CHART
FIG.9 B
DEFECT IMAGE
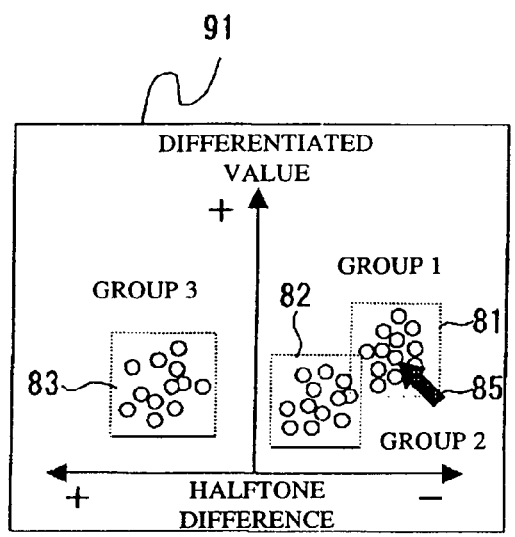
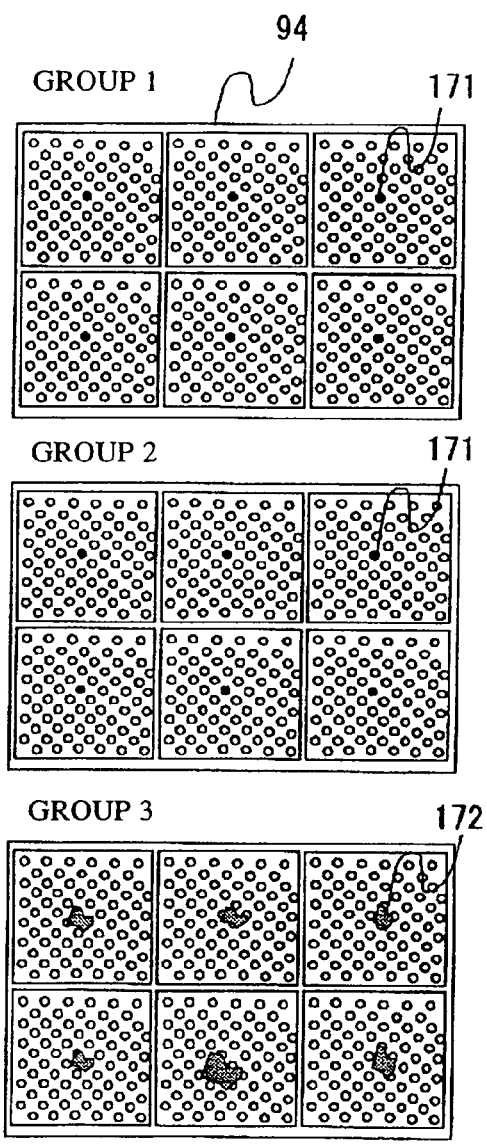

FEATURE QUANTITY DISTRIBUTION CHART

MODIFICATION OF CLASSIFICATION CONDITION

DEFECT IMAGE

FEATURE QUANTITY DISTRIBUTION CHART

DEFECT IMAGE

MODIFICATION OF CLASSIFICATION CONDITION

INSPECTION METHOD AND APPARATUS USING AN ELECTRON BEAM

CROSS REFERENCE TO RELATED APPLICATIONS

The present application is a continuation of U.S. application Ser. No. 11/354,247, filed on Feb. 15, 2006, now U.S. Pat. No. 7,425,704 which in turn is a continuation of U.S. application Ser. No. 10/669,253, filed Sep. 25, 2003, (now U.S. Pat. No. 7,034,298, issued on Apr. 25, 2006). The entire disclosure of the prior applications is incorporated herein by reference.

BACKGROUND OF THE INVENTION

1. Technical Field

The present invention relates to a method and apparatus for inspecting a pattern formed on a substrate having a fine circuit pattern, such as a semiconductor product or liquid crystals, using an electron beam.

2. Background Art

A semiconductor wafer inspection apparatus will be described by way of example. Semiconductor products are manufactured by repeating the lithography and etching processes whereby a pattern formed in a photomask placed on a semiconductor wafer is transferred. During the manufacture of semiconductor devices, the quality of the pattern formed by the lithography and etching processes and the presence of foreign matter, for example, greatly affects the yield of the semiconductor devices. Accordingly, it is necessary to detect the presence of abnormality, particles or defects at an early stage or even before they occur.

At the initial or developing stages of a manufacturing process involving a semiconductor device, various kinds of defects are present in large amounts, each kind of defect having its own cause and therefore requiring different countermeasures or different locations for providing the countermeasures. It is difficult to deal with all of the defects at once, with some defects sometimes affecting one another. Thus, such countermeasures can never be complete in a single operation. If a decrease in a certain defect is observed after a plurality of countermeasures has been implemented, it can be concluded that these countermeasures have been effective. However, when a large number of defects of various kinds are present at an early stage, it is extremely difficult to find out which defect among many can be reduced by which countermeasure. Manufacturing process developers devote their knowledge and effort to finding the optimum process conditions by scrutinizing the defects, the outcome of which depends to a great extent on the experience of experts.

Apparatuses for inspecting defects existing in the pattern on a semiconductor wafer include an optical inspection apparatus that irradiates the semiconductor wafer with white light and compares similar circuit patterns of LSIs using optical images. Another example is an electron beam inspection apparatus, whereby secondary or reflected electrons generated by electron beam irradiation are detected to produce an image such as an SEM, which is then compared with a reference image to detect defects or foreign matter. The term SEM stands for scanning electron beam microscopy.

In these inspection apparatuses, an inspection image and a reference image are compared, and only differing pixels in binarized halftone values of luminance are extracted and defined as abnormal patterns. Based on these abnormal patterns, a defect image is generated or their locations on the semiconductor wafer are displayed, thus notifying the operator of the defects. The operator then transmits the data concerning the distribution of the defects displayed as a defect map on the semiconductor wafer to analysis equipment for probing the cause of the defects. In the analysis equipment, several defects are selected from all the defects, and a detailed analysis is conducted using, for example, observation images obtained by the SEM.

As the defect map usually displays many defects with different causes, it is currently up to how experienced the operator is whether he or she can tell which defect is in need of urgent analysis. This is because of the fact that what the defect map displays are merely differences in the images, which are extracted even though they might not actually be defects, and various kinds of defects could be distributed and displayed on the defect map indiscriminately.

To solve this problem, it has been attempted to display not only just the defect map on the inspection apparatus, but to eliminate those defects for which no defect analysis is necessary and then display only the defects of interest and thus output the defect data. For example, an optical inspection apparatus is not capable of detecting non-electrical defects or short defects created during the contact-hole producing process in a semiconductor device formed on a semiconductor wafer. Such defects, however, can be detected by the electron beam inspection apparatus, and attempts have been made to distinguish one type of defect from another based on a defect image and the coordinates of the defect on the semiconductor wafer (see JP Patent Publication No. 2002-124555 A, page 8 and FIG. 6, for example). However, such as the non-electrical and short defects are not necessarily position-dependent, so that it has not always been possible to accurately distinguish these defects based only on the defect map of the semiconductor wafer.

Apart from the semiconductor device manufacturing processes, methods are known for classifying production defects by a plurality of characteristic values such as the profile and luminance of the defects (see JP Patent Publication No. 2002-174603 A, page 3 and FIG. 6, for example). However, no prior art has been found that describes in concrete terms a method of eliminating unnecessary defects from those defects extracted by the electron beam inspection apparatus during the semiconductor device manufacturing process.

SUMMARY OF THE INVENTION

It is therefore the object of the invention to provide an inspection method and apparatus employing an electron beam that are capable of extracting a desired defect from many defects extracted during inspection.

To achieve this object, in one aspect of the invention, a sample on which a pattern is formed is irradiated with an electron beam, so that an inspection image and a reference image can be generated on the basis of a secondary electron or a reflected electron emitted by the sample. An abnormal pattern is determined based on a difference in halftone values of each pixel between the inspection image and the reference image. A plurality of feature quantities of the abnormal pattern are obtained from an image of the abnormal pattern, and, based on the distributions of the plurality of feature quantities of the abnormal pattern, ranges for classifying the type of the abnormal patterns are designated.

BRIEF DESCRIPTION OF THE DRAWINGS

FIG. 9 shows screens displaying an example of the procedure of identifying defects in the step of setting the defect automatic classification condition.

DETAILED DESCRIPTION OF THE PREFERRED EMBODIMENTS

The method and apparatus for inspecting patterns of the semiconductor device according to the invention will be hereafter described by way of embodiments with reference made to the attached drawing.

Figure 1:
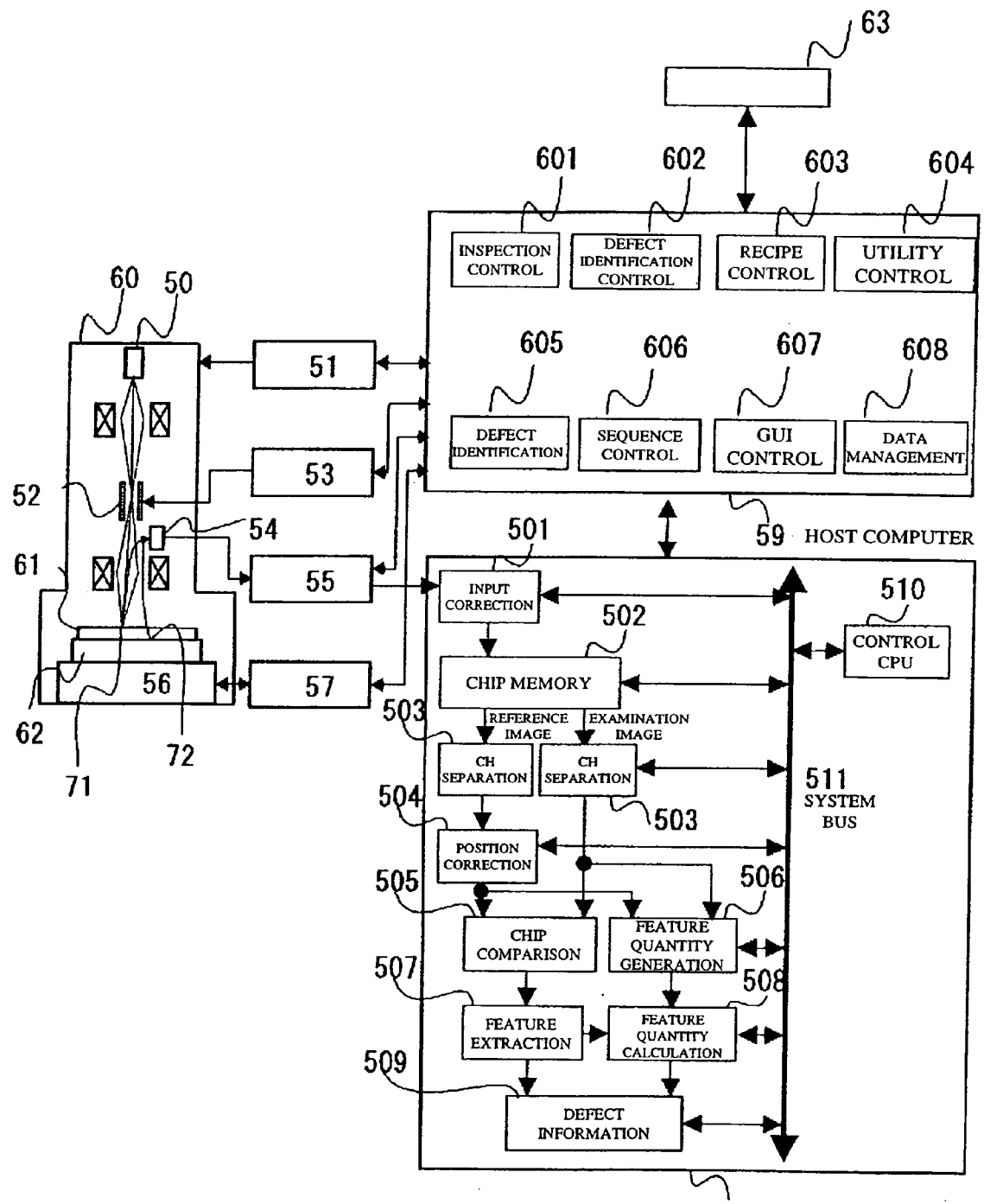
FIG. 1 shows a longitudinal cross-section of an inspection apparatus using an electron beam and a functional block diagram.

FIG. 1 shows an embodiment of the inspection apparatus according to the invention. FIG. 1 shows a longitudinal cross section and a functional block diagram of the inspection apparatus, which uses an electron beam. An SEM main body 60 includes an electron generating unit including an electron source 50, an electron beam scan control unit including a deflecting electrode 52, and a sample manipulating unit including a sample 61, a sample holder 62 and a sample transfer stage 56.

An electron beam 71 emitted by the electron source 50 is accelerated by an accelerating electrode (not shown) and then shone onto the sample 61 retained by the sample holder 62. During that process, electron optics made up of coils and electrodes are controlled by an electron optics control circuit 51 such that the electron beam 71 can be focused at the sample position. The electron beam 71 is scanned by the deflecting electrode 52 and a deflection control circuit 53 in order to produce a striped image in combination with the sample transfer stage 56 controlled by a stage control circuit 57.

As the sample 61 is irradiated with the electron beam 71, a secondary electron 72 is produced at the sample surface. The secondary electron 72 is once again accelerated by an electrode (not shown) and then guided to a detector 54 by another electrode (not shown). The secondary electron captured by the detector 54 is converted into a signal by a detection circuit 55, which signal is then sent to an image processing unit 58.

The image sent to the image processing unit 58 is corrected in an input correction unit 501, which carries out halftone conversion, dark level correction, and beam summing processes, for example. The image thus corrected is sent to a chip memory 502, where the image is temporarily stored on a chip-by-chip basis and a delay image for image comparison is generated. An inspection image and a reference image generated in the chip memory 502 are sent to a channel-dividing unit where the images are divided into a plurality of channels. By thus dividing into multiple channels, it is possible to process the images at a lower processing rate than to process the images each as a whole.

After positional error between the inspection image and the reference image is measured, the images divided into multiple channels are corrected in a position correction unit 504 such that the inspection image and the reference image correspond to one another on a pixel-by-pixel basis. The images thus corrected are sent to a chip comparison unit 505 and a feature quantity generating unit 506. In the chip comparison unit 505, portions of the inspection and reference images where there are differences in the halftone values of each pixel are extracted and outputted as defect image data. The abnormal patterns indicating the differences between the inspection and reference images should be, in more familiar language, referred to as defects in the context of semiconductor wafer circuit pattern inspection. Accordingly, the abnormal patterns will be hereafter sometimes referred to as defects.

Generated feature quantity in the feature quantity generating unit 506 are, for example, the coordinates X and Y of a defect, the size LX and LY of a defect, the area S of a defect, the halftone difference for each pixel in a defect portion, and a differentiated value of the halftone value of a defect portion in the inspection image. The halftone difference herein refers to the difference in halftone value between the inspection image and the reference image in an extracted defect, indicating the luminance of the pixel or pixels in the defect portion of a defect image extracted from the inspection and reference images. The differentiated value of a halftone value indicates an absolute value of the gradient of the halftone values of a pixel in a defect portion and pixels around that pixel in an inspection image or the reference image, namely the contrast of luminance between the pixel in the defect portion and the pixels around that pixel. The gradient is referred to as the differentiated value of the halftone value because it can be obtained by differentiating a pixel $f(x, y)$ in the defect portion. The defect image obtained from the inspection and reference images is sent to a feature extraction unit 507, where the projection length and area, for example, of the defect portion are obtained based on the aforementioned feature quantities.

In a feature quantity calculating unit 508, the halftone differences and the differentiated values of halftone values sent from the feature quantity generating unit 506 are compared with the basis of the defect portion. Specifically, feature quantities of the defect portion are calculated, such as a sum D of the halftone differences in all of the defects and a sum H of the absolute values of differentiated values of the halftone values in all of the defects. The values obtained in the feature extraction unit 507 and those obtained in the feature quantity calculating unit 508 are collected in a defect information unit 509 and quantified. These calculations are controlled by a control CPU 510 connected via a system bus 511. The quantified defect information is sent to a host computer 59 by the control CPU 510.

While in the present embodiment the defect detection process step in which chips on a semiconductor wafer are compared with one another is described by way of example, the image processing may be carried out on a cell-by-cell basis, instead of chip-by-chip basis, in cases where cells of identical structure are regularly arranged, such as in a cell mat portion of a memory. However, during the position correction, no detection of large position error between images would be required, as the inspection image would be shifted by a cell pitch during position correction. Further, the inspection image and the reference image may be obtained by dividing the image prior to the position correcting unit 504, instead of dividing the inspection image and the reference image into channels individually from the chip memory 502.

The host computer 59 has the functions of receiving instructions from the operator and controlling the apparatus as a whole, as well as displaying information on a monitor 63 equipped with the GUI (graphical user interface) function. For example, the host computer 59 includes an inspection control unit 601 for controlling an inspection sequence, and a defect confirmation control unit 602 for creating a defect distribution chart based on the defect feature quantities, as will be described later, and confirming the defects classified by the feature quantities. The host computer 59 further includes a recipe control unit 603 for creating an inspection recipe, a utility control unit 604 necessary for the operation of the apparatus, a defect judging unit 605 for extracting true defects from the defect information, and a sequence control unit 606 for controlling the entire operation including the inspection and defect confirmation. Also included in the host computer are a GUI control unit 607 for controlling the GUI function, and a data management unit 608 for managing data such as the inspection result, defect images, and recipe information.

Figure 2:
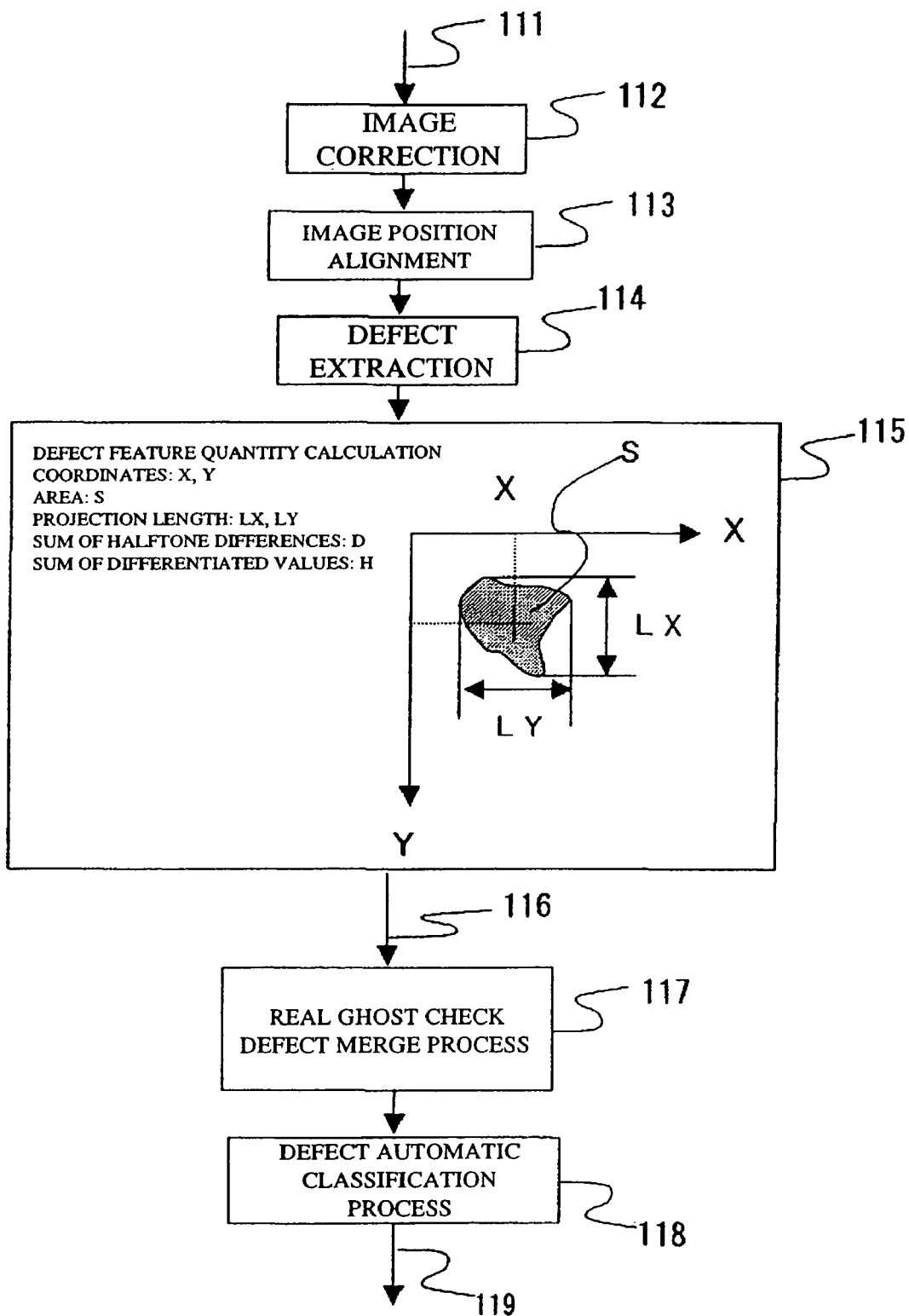
FIG. 2 shows a flowchart of the procedure starting from the detection of defects to the automatic classification of the defects.

FIG. 2 shows a flowchart of the sequence starting from the detection of defects to the automatic classification of the detected defects. Steps 112 to 117 are carried out in the individual functions shown in FIG. 1, while step 118 is carried out in the GUI function interacting with the operator.

In step 112, an inspection image 111 that has been transmitted is corrected in the input correction unit 501 of the image processing unit 58 shown in FIG. 1, such that defects can be easily extracted therefrom. In step 113, the positions of the inspection image and a reference image are aligned in the position correction unit 504. In step 114, the inspection image and the reference image are compared in a chip comparison unit 505 to extract defects. For example, a defect is extracted by finding the difference between the inspection image and the reference image, and then determining whether or not the difference exceeds a specified value. Thereafter, in step 115, the feature quantities of the defect are calculated in the feature quantity calculating unit 508 based on a defect image obtained by the defect extraction in the feature extraction unit 507.

As mentioned above, the defect feature quantities include the coordinates X and Y of a defect, the size LX and LY of a defect, the area S of a defect, a sum D of halftone differences of a defect portion, and a sum H of differentiated values of halftone values between a pixel in a defect portion and adjacent pixels in an inspection image or a reference image. The coordinates of a defect can be arbitrarily selected as long as there is a correspondence between the image processing apparatus and the main unit. In the present example, an X and Y coordinate system is tentatively determined as shown in FIG. 2. While the shape of a defect may vary, the widths of the shape of a defect as projected on the X and Y axes will be indicated by projection lengths LX and LY, respectively. The position of the center of the projection will be designated as the coordinates X and Y of the defect. The area S of the defect portion is the area of the portion considered defective, and the area can be calculated from the number of pixels.

In step 115, the information about the defect portion is acquired, as mentioned above. Here, the sum D of halftone differences in the defect portion and the sum H of the absolute values of the differentiated values of the pixels in the defect portion may be standardized by dividing by the area S, so that they are converted into feature quantities not dependent on the area of the defect.

Defect information 116 is generated based on the aforementioned feature quantities for each defect detected in the defect information unit 509.

Then, in step 117, the defect judging unit 605 of the host computer 59 carries out a real ghost process for extracting true defects out of the defect information, and a defect merge process for aggregating adjacent defects into one.

For instance, the defect information is obtained from the defect extraction step 114 twice for each defect. Namely, a first defect is detected as a defect appears and is compared with a first reference pattern. Then, a second defect is detected as a defect appears as the, reference and is compared with a normal pattern. Of these two defects, the first defect is called a real defect, and the second defect is called a ghost defect. If these two defects are located at a corresponding position, the first defect is considered the true one. By carrying out this real ghost check, pseudo-defects or the like created by noise can be eliminated.

The defect merge process, whereby adjacent defects are aggregated into one defect, is carried out as necessary. This process is carried out following the real ghost process.

In step 118, a defect automatic classifying process is carried out, whereby the type of the defect extracted by the real ghost process is determined based on the feature quantities of the defect, and then classified, outputting defect information 119 with classified results. This process is carried out by the GUI control unit 607 of FIG. 1 in accordance with the operator's inputs on the screen shown on a monitor 63.

Figure 3:
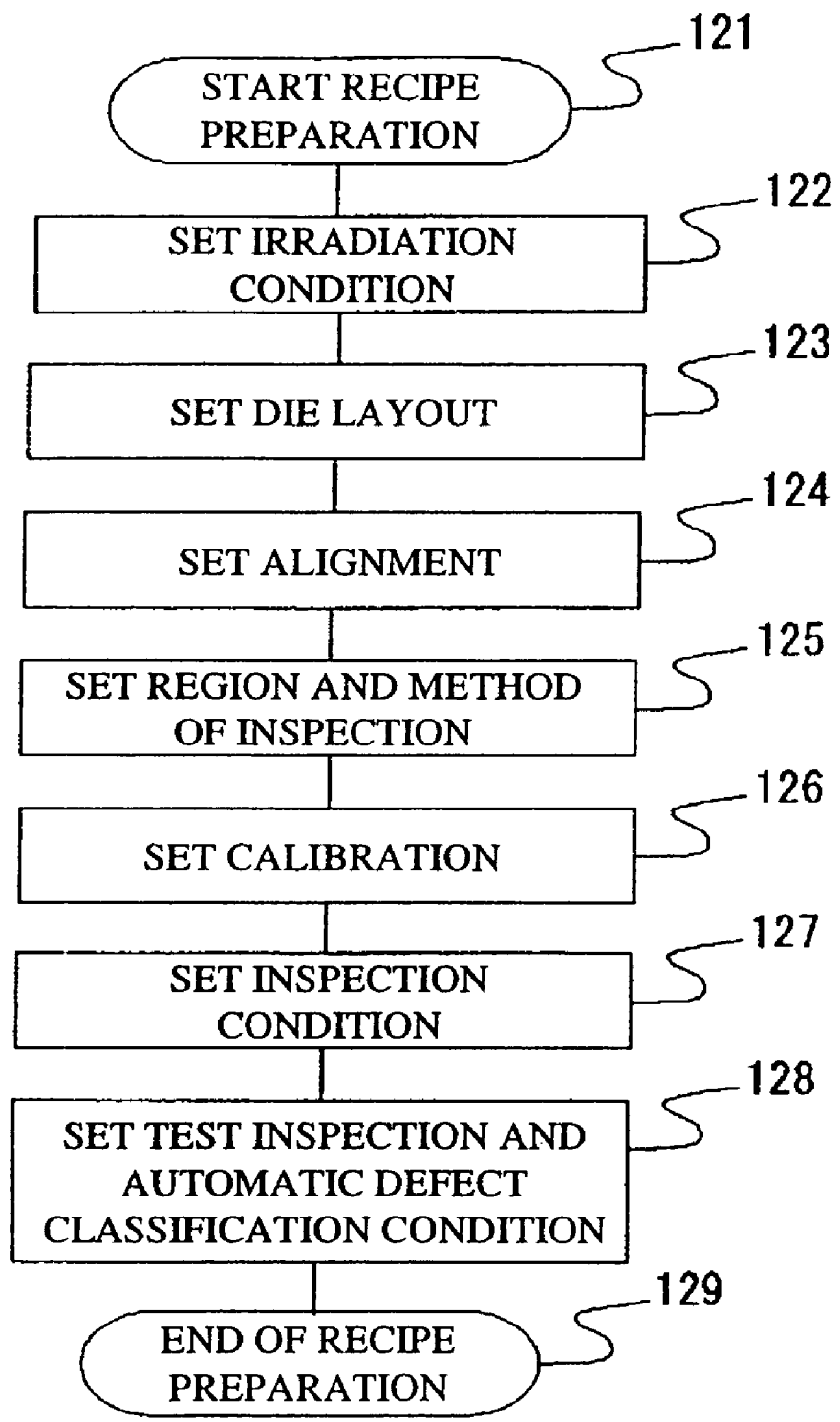
FIG. 3 shows a flowchart of the procedure of creating an inspection recipe.

FIG. 3 shows a flowchart of the sequence of creating inspection conditions defining the contents of the inspection of a circuit pattern, namely the inspection recipe. Items to be set up in a recipe include the irradiation condition, die-layout, alignment, inspection region and method, calibration, inspection condition, and defect automatic classification condition. The order of these may be modified, and it is also possible to return to an earlier item and reset. The recipe creation is conducted by a recipe control unit 603 of the host computer 59 shown in FIG. 1.

Following a recipe creation start instruction from the operator in step 121, the irradiation condition for the electron beam 71 shown in FIG. 1 is set in step 122. In this step, the inspection pixel size, the number of addition of images, and SEM-image focus condition can be set by the operator, as well as the conditions relating to the electron optics.

During the die-layout setting in step 123, the operator sets up the arrangement of the die within the semiconductor wafer to be inspected. During the alignment setting in step 124, based on the measurement results such as the amount of rotation and position of the semiconductor loaded in the apparatus, calculations of correction values are carried out such that an intended position in the intended die can be inspected by the apparatus.

In step 125, an inspected region and an inspection method for the semiconductor wafer are set by the operator, as will be described below. The setting of the inspection region includes the designation of which die is to be inspected and which portion of the die is to be inspected. In the designation of the inspected region in the die, the region of cell comparison may be set in a region where a repeating pattern such as in a memory cell is formed. When conducting die comparison, the region of die comparison is designated. With regard to the inspection method, designations are made as to whether a designated region is inspected by cell comparison, by die comparison, or by a mixed comparison whereby a cell comparison and a die comparison are carried out simultaneously. It is also possible to designate whether the semiconductor wafer is to be inspected in the X or Y direction.

In the calibration setting in step 126, the position of calibration, the brightness settings, and the contrast settings, for example, can be set by the operator, so that the brightness and contrast, e.g., of an inspection image can be optimized.

In the inspection condition setting in step 127, mainly the threshold of defect detection and the detailed method of cell comparison and die comparison are designated by the operator. In the test inspection and the setting of the defect automatic classification condition in step 128, a sample image of the wafer is obtained and conducted within the test inspection, and then a classification condition for the automatic classification of defects is designated, using the defect information detected in the test inspection. By making the above settings, an inspection recipe for the semiconductor wafer is prepared.

Figure 4:
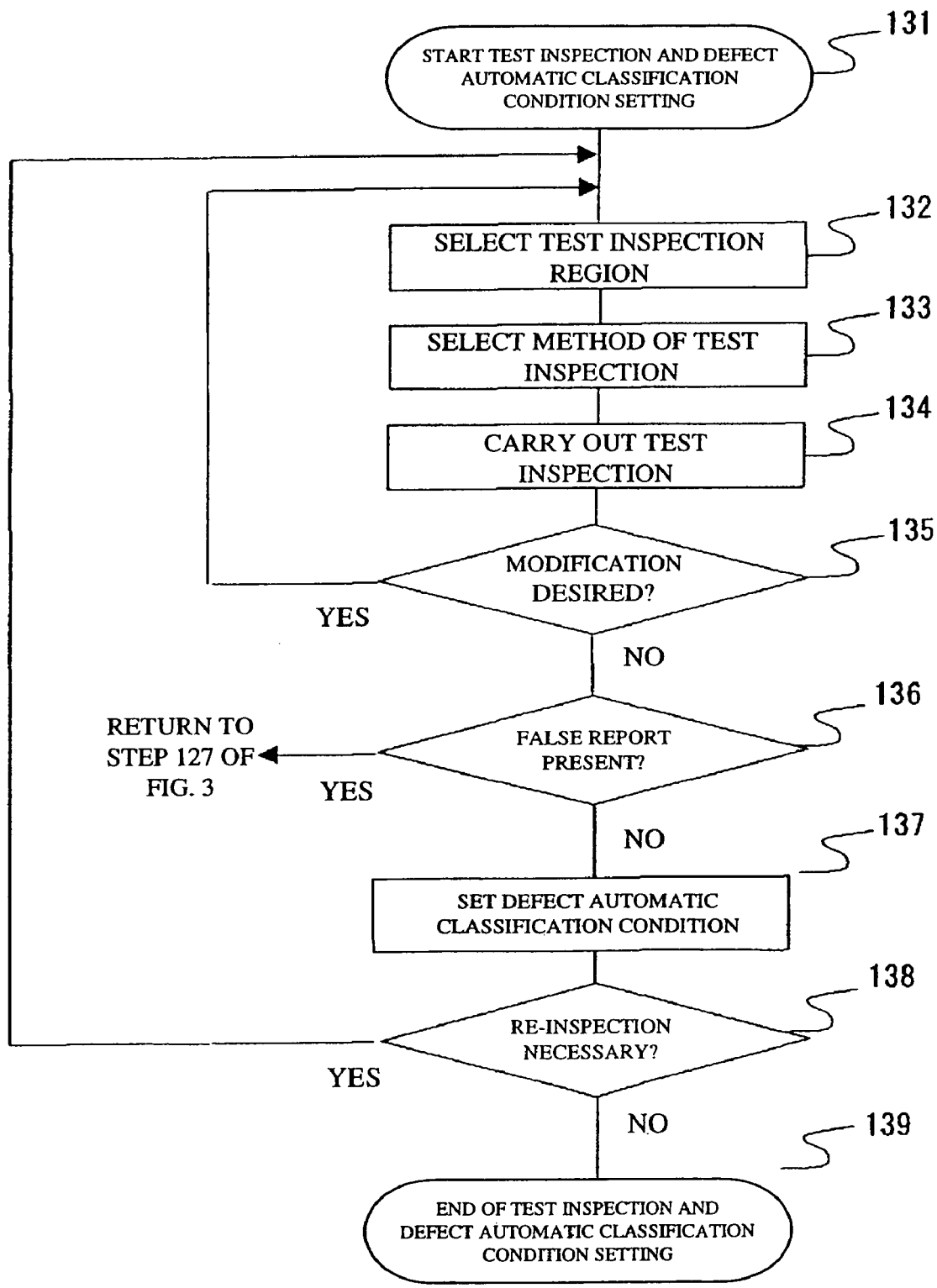
FIG. 4 shows a flowchart illustrating in more detail an example of the procedure of a test inspection and defect automatic classification condition setting.

FIG. 4 shows a flowchart illustrating in more detail the procedure of the test inspection and the setting of the defect automatic classification condition in step 128 shown in FIG. 3. During the test inspection, the routine may return to the step of setting inspection conditions as necessary, in order to confirm the inspection condition, such as the threshold, that has been previously set.

Upon reception of an instruction for starting the test inspection and the setting of defect automatic classification condition in step 131, the inspection region for the implementation of the test inspection is selected in step 132, and then the method of test inspection is selected in step 133. In step 134, an instruction for implementing the test inspection is made in step 134, whereupon a test inspection is conducted. The inspection region and inspection method are provided with a degree of freedom such that the previously designated contents can be modified. Accordingly, if a certain change is considered effective in step 135, a request for change is designated in step 136, so that the routine can return to step 132 of selection of the inspection region and step 133 of selection of the inspection method to effect the change. If, as a result of test inspection, a false report is recognized in step 137, the routine returns from step 136 to step 127 of FIG. 3, where the inspection condition is reset and step 128 is repeated. The aforementioned individual conditions are adjusted until it is determined that the inspection is more or less normal.

One major factor for the generation of a false report in the inspection result is the use of an inappropriate inspection condition. For example, if an inspection condition is such that the irradiation energy of the electron beam is low, irregularities could be produced in the brightness of the image of the detected pattern due to charge irregularities in the sample. As a result, when two images are compared, the brightness irregularity produces a difference that is detected as an abnormal pattern. Such an abnormal pattern is not due to an actual defect and is therefore referred to as a false report that must be eliminated from the group of defects.

Also, in the case of cell comparison, where it is necessary to designate a repetition pattern in the inspection region, a difference in the pattern profile is naturally produced in case a non-repetition pattern is erroneously set as the inspection region for cell comparison and is detected as an abnormal pattern.

When the problems are eliminated in the above steps, a condition for the automatic classification of defects is set in step 139. During the setting of the defect automatic classification condition, a classification condition by which defects can be distinguished by their types and thus classified is sought, using the defect feature quantities obtained during inspection. When the classification condition is set, it is preferable to increase the number of samples by implementing re-inspections, depending on the need of the operator, for the reliability and validity of the result increase as the number of defect samples increases.

Figure 5:
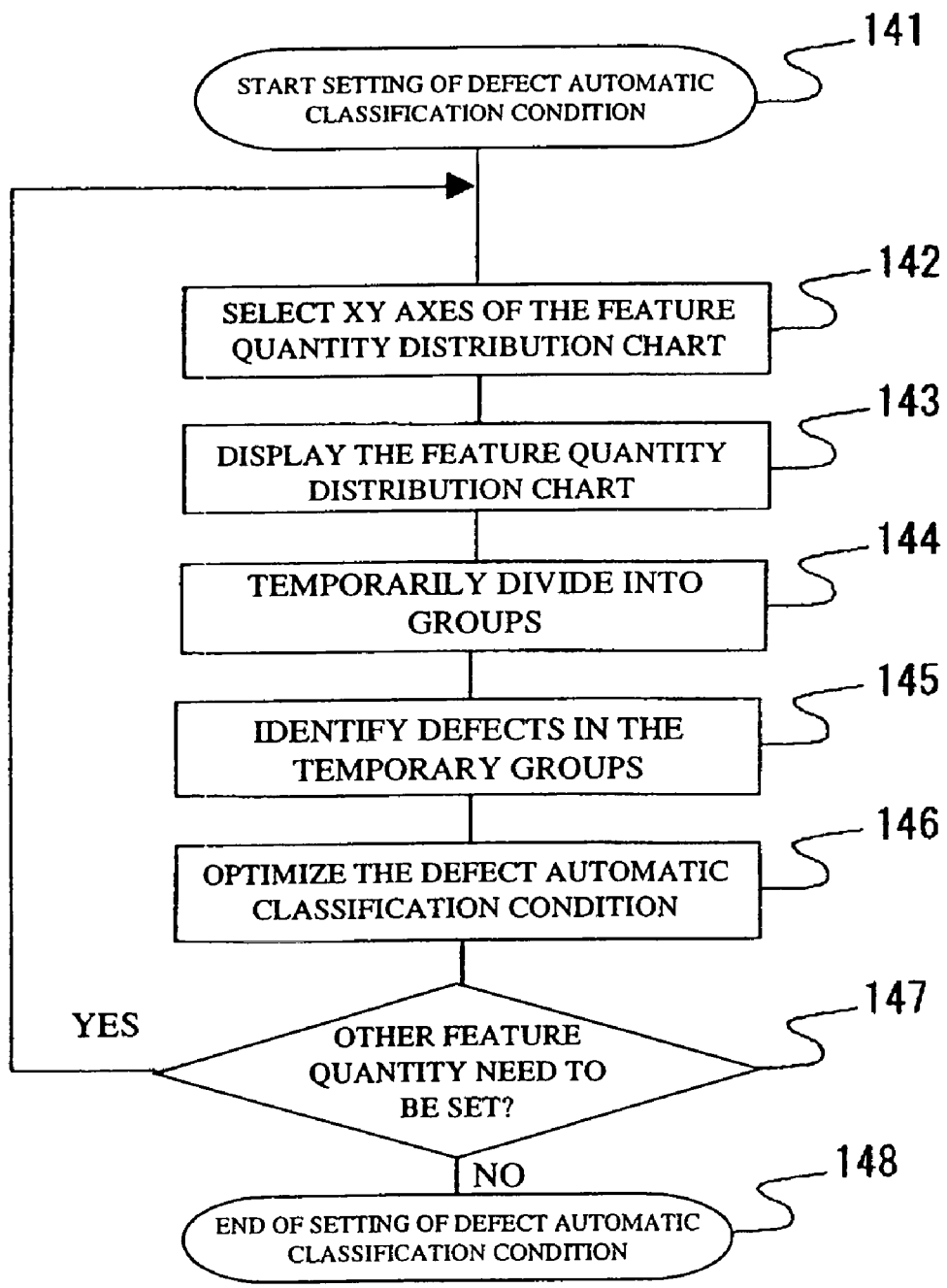
FIG. 5 shows a flowchart illustrating in more detail the procedure of setting a defect automatic classification condition.
Figure 6:
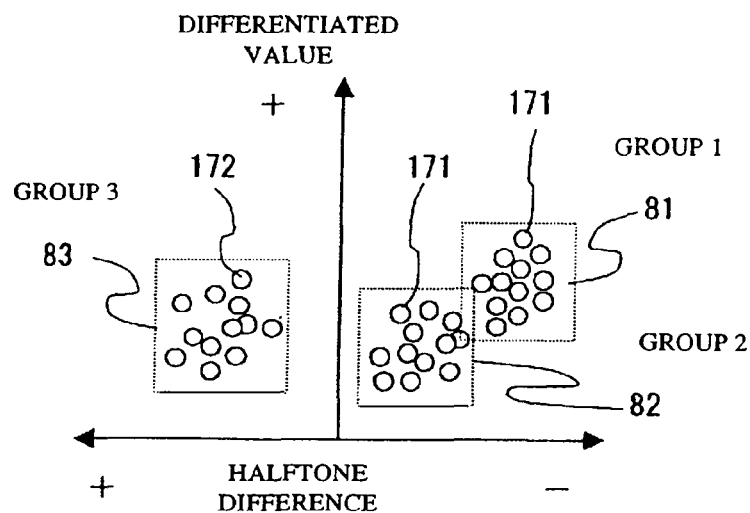
FIG. 6 shows a monitor screen displaying an example of the distribution chart.

FIG. 5 shows a flowchart describing in detail the procedure of the setting of defect automatic classification condition in step 137 shown in FIG. 4. FIG. 6 shows a monitor screen displaying an example of a distribution chart.

Electron beam images can produce a false defect in which an undesired contrast is generated in the inspection image due to the charge potential in the irradiated area. For example, in case the energy of the electron beam (normally not more than 1 keV) is low, a contact hole with an increased resistance with reference to the substrate due to faulty conduction in the bottom of the contact hole, for example, tends to appear darker than a normal contact hole. Such a non-electrical defect appears in the inspection image as a black defect. In case of short defect, on the contrary, the amount of secondary electrons emitted increases, so that the relevant location becomes brighter than the surrounding portions and appears as a white defect. Thus, when an electric abnormality can be detected as changes in brightness in the pattern in the inspection image, such abnormality is referred to as a voltage contrast (VC) defect. Resist residues which are not VC defects appear brighter than the surrounding patterns. This is considered due to the increased amount of secondary electrons as compared with the surrounding patterns. Thus, reviewing an abnormal pattern present in the extracted defects and by analyzing that image, the non-electrical defect in VC defects can be distinguished from foreign matter such as resist residue, using the halftone difference between these defects as the reference for judgment.

On the other hand, the difference between the halftone value of each pixel in an abnormal pattern in the inspection image and the halftone value of each pixel in the areas around the abnormal pattern, namely a differentiated value, is larger for foreign matter than for a short-circuit defect even though they both appear as white defects. It is considered to be due to irregularities on the surface of foreign matter that foreign matter has a larger differentiated value.

Thus, a non-electrical defect and foreign matter or short-circuit defect can be distinguished based on halftone difference, and foreign matter and a short-circuit defect can be distinguished based on the differentiated value of halftone values. Accordingly, the halftone difference and the differentiated value of halftone values are adopted as feature quantities of defects, based on which a defect distribution chart is created.

As described above, two kinds of feature quantities of defects, namely the halftone difference and the differentiated value of halftone values, are selected as the feature quantities of defects in the present embodiment, with each assigned to the X- and Y-axis of the distribution chart in step 142. Other feature quantities may include the coordinates X and Y of a defect, the size LX and LY of a defect, and the area S of a defect. They may also include calculated values such as a shape value LX/LY that can be calculated from the feature quantities. In such cases, too, a distribution chart similar to the one of the present embodiment can be created as necessary.

In case the two kinds of feature quantities are selected, the defects are arranged on a two-dimensional graph as that in the present embodiment, whereby it is relatively easy to carry out classification based on the feature quantities of defects. In case three kinds of feature quantities are selected, they are individually assigned to the X-, Y- and Z-axis, thus generating a three-dimensional graph. When one kind of feature quantity is selected, the halftone differences of those defects remaining after filtering all of the defects according to size may be plotted on the X-axis, with the Y-axis indicating the number of defects, namely the frequency of appearance of defects.

Referring back to the present embodiment, in step 143, a distribution chart shown in FIG. 6 is created in which the halftone difference is indicated along the X-axis and the differentiated value of the halftone value is indicated along the Y-axis, and the chart is shown on the monitor. The direction of increase or decrease of the values of the halftone difference along the X-axis is determined taking into consideration the operator's ease of use. For example, in the present embodiment, the non-electrical defect of contact holes rather than foreign matter is extracted and analyzed. Thus, in the present embodiment, the origin is at the point of intersection of the X- and Y-axes, with the positive side located towards left and the negative side towards right. In this way, the value of the halftone difference becomes smaller, i.e., the defects in the image appear darker, as it goes from left to right, so that the defects on the right-hand side of the Y-axis can be given greater attention. The differentiated value on the Y-axis increases upward, so that the defects in the image appears brighter. In the present embodiment, non-electrical defects and foreign matter are distinguished by way of example, for simplicity. An example of distinguishing a short-circuit defect and foreign matter will be described later.

In step 144, the operator finds a group of defects in the distribution chart that is being displayed. Then, boundary conditions for separating individual groups of defects are set, as indicated by the dotted lines in FIG. 6, thus dividing the defects into preliminary groups. Such preliminary grouping may be carried out by the operator making designations using the GUI function, as will be described with reference to FIG. 6 later, or the preliminary groups may be automatically generated by the apparatus, which can then be confirmed by the operator.

Next, in step 145, the operator identifies the defects in each preliminary group sequentially, and determines the nature of defects in each group using a method described later. In step 146, after the types of the defects are identified, the boundaries of the previously set groups are reviewed in order to optimize the defect automatic classification condition. In step 147, in case there are many defect feature quantities, it is determined whether or not another distribution chart for other feature quantities should be created. In step 148, the setting of the defect automatic classification condition is completed.

Now referring to the example of the distribution chart of FIG. 6, an example of the manner in which the grouping is carried out will be described. It will be assumed that the distribution of the feature quantities of the defects that have been extracted is roughly divided into three groups, as shown in FIG. 6. Based on that assumption, a boundary condition by which the groups are divided is set. The GUI function includes a mouse drag function by which a group of multiple defects can be encircled in a rectangular region. Alternatively, it is also possible to calculate the distances between the defects in the defect confirmation control unit 602 shown in FIG. 1, and automatically generate groups such that each group consists of defects with mutual distances that are smaller than a predetermined value.

In the present embodiment, rectangular regions are set, and, if a distribution based on a feature quantity of a defect is included in a particular rectangular region, that defect is regarded as belonging to that group. A rectangular region 81 will be referred to as group 1, a rectangular region 82 group 2, and another rectangular region 83 group 3, each group containing some of the defects 171 and 172 represented by circles.

While the regions are represented by rectangular shapes in the present example, they may have other arbitrary shapes, such as circular or elliptical, for grouping. If the boundary conditions of a plurality of groups overlap, the grouping may be carried out by providing priority, for example.

Figure 7:
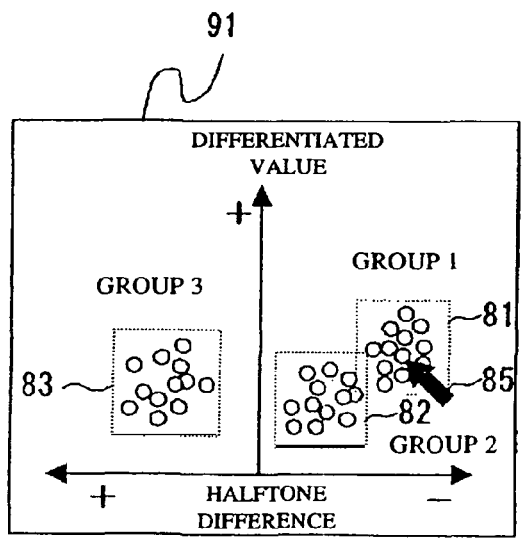
FIG. 7 shows screens displaying an example of the procedure of identifying defects in the step of setting the defect automatic classification condition.
Figure 7:
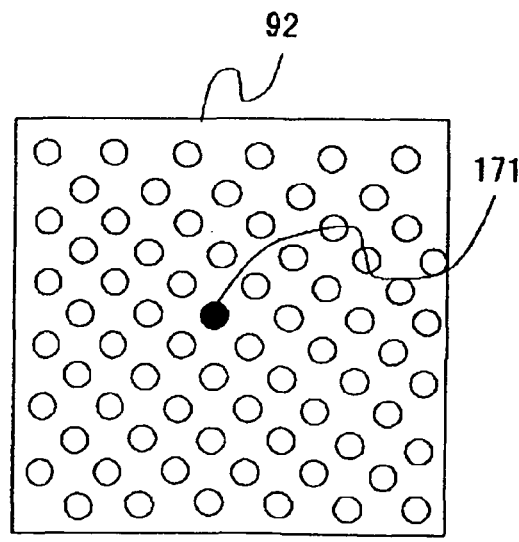

FIG. 7 shows example screens displaying the procedure of identifying defects in the step of setting the defect automatic classification condition. FIG. 7A shows a distribution chart similar to the one shown in FIG. 6, while FIG. 7B shows a screen displaying a defect image obtained by the inspection apparatus using an electron beam.

In a monitor screen 91 shown in FIG. 7A, when, of the three groups of defects, namely the rectangular regions 81, 82 and 83 indicated by dotted lines, the operator wishes to identify the type of defects in group 1, namely the region 81, while looking at the inspection image, the operator moves an arrow 85 on the screen to one of the circles in the region 81 indicating the group-1 defects, using a mouse, for example, and then clicks on the circle, thus designating the particular group.

As group 1 is thus designated, an image is newly acquired that has the coordinates of the designated defect at the center, thus displaying a defect image as a screen 92 on the monitor 63, as shown in FIG. 7B. In this example, defect 171 exists in the hole indicated by the black circle in the pattern of many holes, and it can be seen that, because of the contrast in the defect image, for example, the defect is a black circle defect, namely a non-electrical defect.

While in the present example an inspection image is newly acquired, inspection images may be stored in a memory (not shown) during inspection, so that a defect image corresponding to a designated defect can be selected from the stored defect images and then displayed.

In this manner, the operator sequentially confirms the defect images and thereby inspects the type of the defects in group 1. In this case, it may be advantageous to store in a memory (not shown) a defect image whenever it is newly acquired. The acquisition of defect images not only takes time but could also result in a trouble such as contamination if the same location is irradiated by the electron beam repeatedly. To prevent this, the defect images may be stored so that no defect image is newly acquired when the same defect is once again designated.

Figure 8:
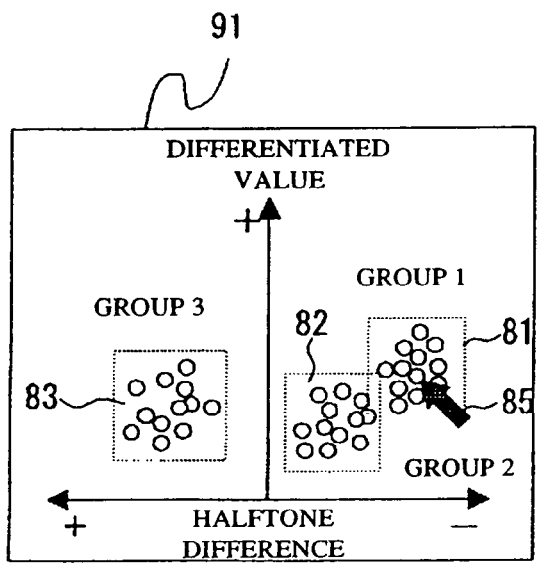
FIG. 8 shows screens displaying an example of the procedure of identifying defects in the step of setting the defect automatic classification condition.
Figure 8:
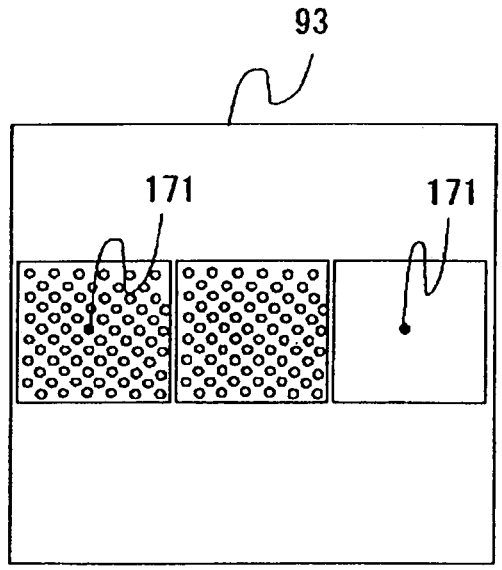

FIG. 8 shows screens illustrating an example of the procedure of identifying defects in the process of setting a defect automatic classification condition, similar to the ones shown in FIG. 7. FIG. 8A shows the screen displaying a distribution chart, while FIG. 8B shows the screen displaying a defect image acquired by the inspection apparatus using an electron beam.

FIG. 8 shows a case where, as another embodiment of the defect identifying procedure in the setting of defect automatic classification condition, a function is added for storing a defect image detected during inspection. The operator, as in the case of the example of FIG. 7, designates group 1 of defects in the distribution chart displayed on a screen 91 of FIG. 8A. In FIG. 8B, a screen 93 displays, from left to right, an inspection image, a reference image, and an abnormal-pattern extraction image, which is a differential image between the inspection and reference images. In the illustrated example, an abnormal pattern exists in the inspection image, while no abnormal pattern exists in the reference image, and the extraction image shows an image indicating the difference between them in the amount of signals. By comparing the abnormal pattern in the inspection image and the same location in the reference image where there is no abnormality, the operator can identify the abnormality based on the brightness, size and shape, for example, of the abnormal pattern relative to the normal pattern. Thus, displaying the images at the time of defect extraction in a manner such that they can be compared with one another helps the operator determine the type of defects.

FIG. 9 shows a screen displaying an example of the procedure for identifying defects during the process of setting the defect automatic classification condition, as does FIG. 7. FIG. 9A shows a screen displaying a distribution chart, and FIG. 9B shows a screen displaying a defect image acquired by the inspection apparatus using an electron beam.

In FIG. 9A, the operator designates one circle after another in group 1 using an arrow 85, and then a defect image of the corresponding defect is selected from the stored defect images and displayed one by one on the screen 94 shown in FIG. 9B. Similar images are displayed for groups 2 and 3 as well. Thus, the operator can confirm the inspection images of defects on a group-by-group basis, so that he or she can easily identify the type of the defects in each group. A plurality of inspection images may be displayed on a single screen 94, or alternatively, one image may be displayed at any one time on the screen. Further, while not shown, an ID may be displayed at a portion of an inspection image that identifies the defect, such as the coordinates of the relevant defect or a number assigned therefore 6.

If a defect in the region 81 in group 1 on the screen 91 of FIG. 9A is designated and a defect 171, which is indicated by a black circle in the figure of the pattern of contact holes, is displayed in the defect image of group 1 on the screen 94 shown in FIG. 9B, it can be seen that group 1 is a group of non-electrical defects. It is also seen that group 2, including a defect 171 with a different contrast represented by either a black or gray circle in the figure, is a group of non-electrical defects, as well as group 1. In a defect image, a completely non-electrical defect appears dark, while a not-completely non-electrical defect appears a little brighter. As a result, defects with different halftone differences and different differentiated values of halftone values are displayed, as shown in FIG. 9A, even though they are all non-electrical defects.

In group 3 with the opposite sign for halftone differences, when the defects are seen in a defect image, as shown in group 3 of FIG. 9B, defects 172 with various shapes can be seen at locations that have nothing to do with the pattern of contact holes, with the defects appearing bright in contrast to the non-electrical defects in groups 1 and 2. Empirically, it can be determined that substances with amorphous shapes are foreign matter. Many kinds of foreign matter are dependent on the manufacturing process of the semiconductor apparatus; however, in the hole-pattern forming process, resist residues are often found, which appear brightly upon irradiation with an electron beam, as described above.

Figure 10:
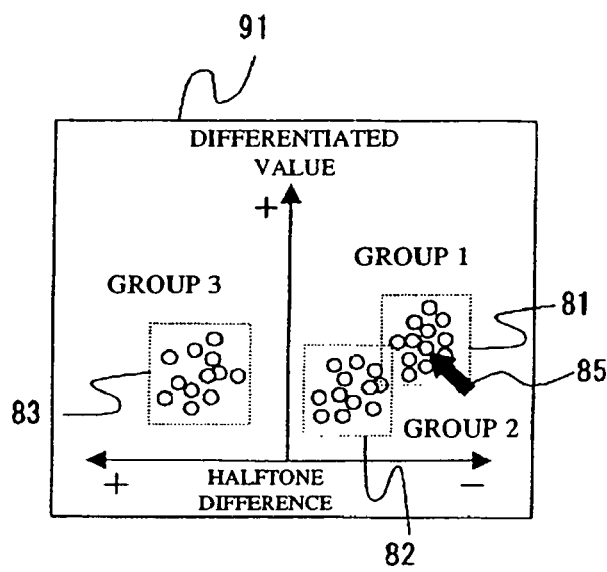
FIG. 10 shows screens displaying an example of the procedure of identifying defects in the step of setting the defect automatic classification condition.
Figure 10:
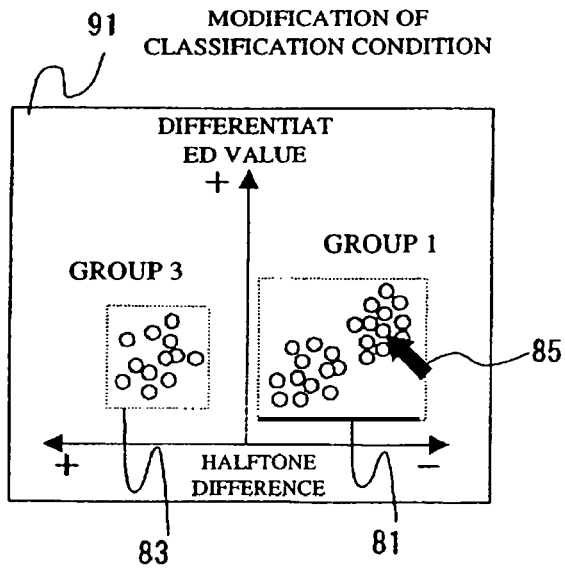
Figure 10:
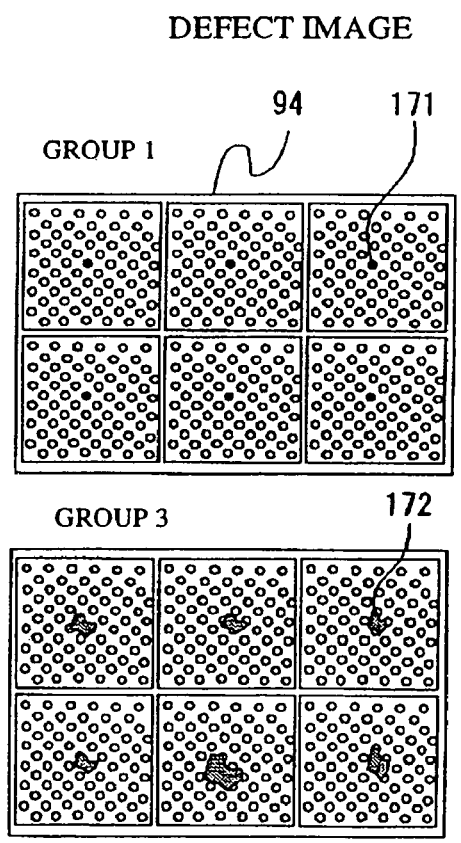

FIG. 10 shows a screen illustrating an example of the procedure of identifying defects in the step of setting the defect automatic classification condition, similar to the one shown in FIG. 7. FIGS. 10A and 10B show screen displaying distribution charts. FIG. 10C shows screen displaying defect images acquired by the inspection apparatus using an electron beam.

As it has been learned from the procedure shown in FIG. 9 that the defects in groups 1 and 2 in the distribution chart are of the same type, the two groups are combined into one, as will be described later.

In FIG. 10A, as the operator designates a region 84 using an arrow 85, for example, where the region 81 of group 1 and the region 82 of group 2 are superposed, the region 82 of group 2 is automatically absorbed into the region 81 of group 1, thus creating a new region 81, as shown in FIG. 10B. Thus, group 2 can be eliminated and thereby the boundary condition of group 1 can be modified. The operator then designates circles in the region 81 of group 1 in the screen 91 of FIG. 10B, so that defect images are displayed on the screen 94 as shown in FIG. 10C. The operator can then determine whether or not the defects 171 in group 1 are non-electrical defects, and whether or not the defects 172 in group 2 are foreign matter. After the type of each group is thus identified, each group is allocated a classification code, for example, indicating the result of classification of the group, and the code is stored as data, thus completing the setting of the defect automatic classification condition for the preparation of a recipe shown in FIG. 3.

Figure 11:
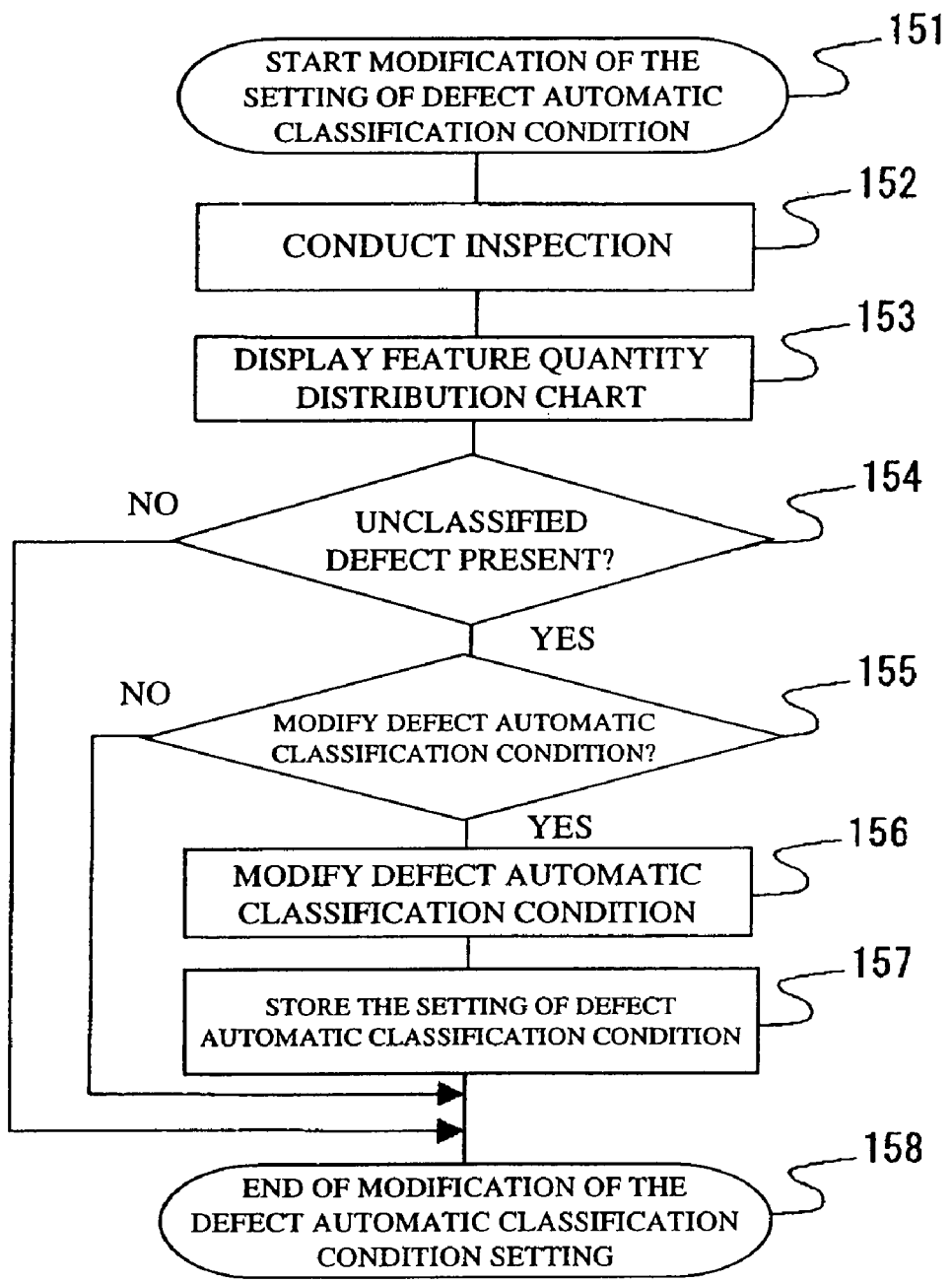
FIG. 11 shows a flowchart of an example of the procedure of modifying the defect automatic classification condition.

FIG. 11 shows a flowchart illustrating an example of the procedure of modifying the defect automatic classification condition. In this procedure, the defect automatic classification condition is modified after the implementation of inspection using the recipe in which the defect automatic classification condition has been set. Because the defect automatic classification condition is set upon creation of the recipe, the result of automatically classifying the defects by the automatic classifying function can be obtained once the inspection is over, in addition to the information about the location where the defects were detected. After the implementation of inspection, the number of samples of defects extracted is greater than that during the preparation of the recipe, it can be well expected that, upon display of the distribution chart of the feature quantities, there are some defects that are displayed outside of the region boundary of the classification condition set during the preparation of the recipe. Accordingly, if the operator's defect identification shows that a defect that is outside a region belongs to the group of that region, the operator is allowed to modify the classification condition that was created during the preparation of the recipe, so that he or she can modify the recipe. This procedure will be described below.

The operator, after instructing the start of the procedure in step 151, instructs the implementation of inspection using the recipe in which the defect automatic classification condition has been set, in step 152. In step 153, a distribution chart of the defect feature quantities is displayed when the inspection is over. In step 154, the operator determines the presence or absence of unclassified defects that are outside the region of the defect classification condition. Specifically, the operator determines the presence or absence of defects displayed outside of the region 81 or 83 shown on the screen 91 of FIG. 10B.

If the operator determines in step 155 that there are unclassified defects and therefore the defect automatic classification condition must be modified, the defect classification condition is modified in step 156. The result of modification is stored in the recipe in step 157, and the procedure is completed in step 158.

Figure 12:
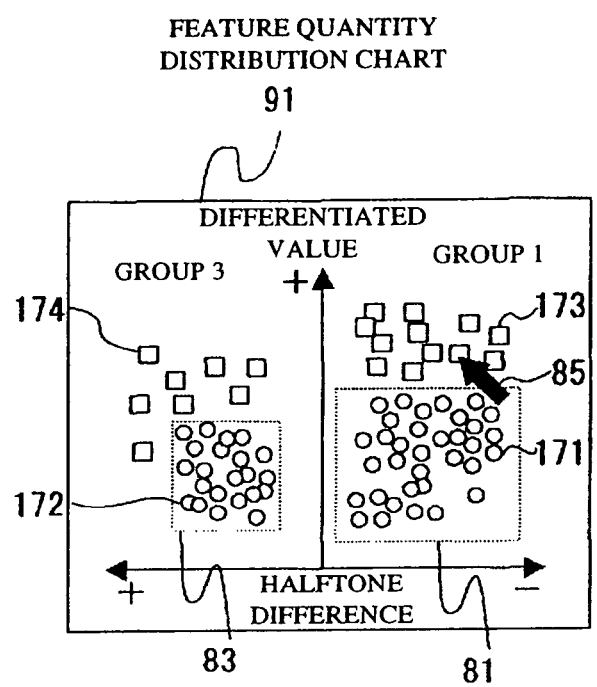
FIG. 12 shows screens displaying an example of the procedure of identifying defects in the step of setting the defect automatic classification condition.
Figure 12:
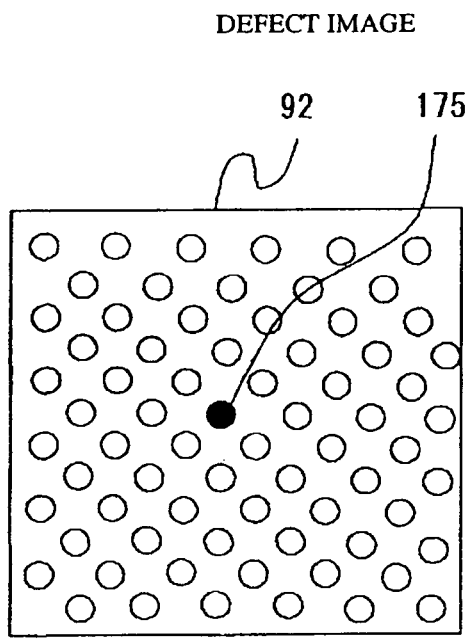
Figure 12:
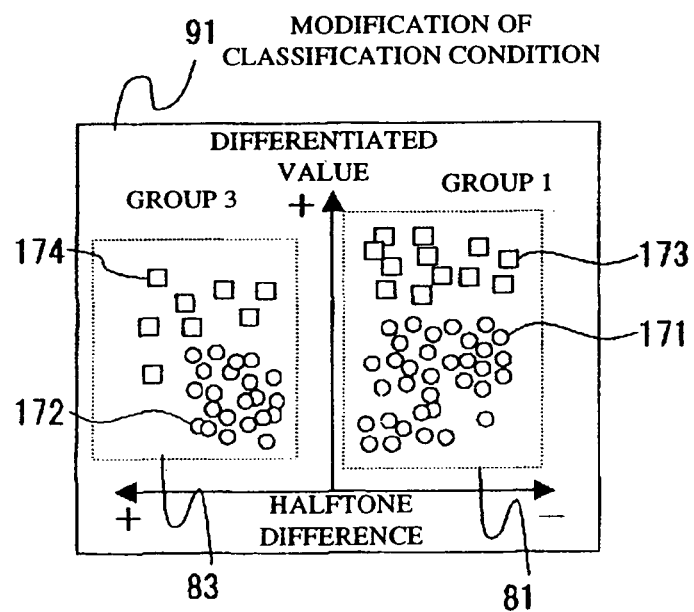

The above procedure will be described by referring to the drawings. FIG. 12 shows the screen illustrating an example of the procedure of identifying defects in the step of setting the defect automatic classification condition, similar to the one shown in FIG. 7. FIGS. 12A and 12B show screen displaying distribution charts. FIG. 12C shows a screen displaying a defect image acquired by the inspection apparatus using an electron beam.

As described with reference to FIG. 11, an inspection is carried out using the recipe in which the defect automatic classification condition has been set, and after the inspection is over, a distribution chart of the defect feature quantities is displayed. In FIG. 12A, the distribution chart displayed in the screen 91 shows defects 173 and 174 outside the regions 81 and 83 that are indicated by squares, in addition to the defects 171, which are non-electrical defects, and defects 172, which are foreign matter, that are indicated by circles contained in the regions 81 and 83. When such defects are newly found in the distribution chart of the feature quantities outside of the classification condition that has been set during the preparation of the recipe, the operator identifies the defects and then re-set the classification condition.

Specifically, as shown in FIG. 12A, the operator designates the defect 173 to be identified with an arrow 85, using a mouse, for example, so that a defect image is displayed on the screen 92, as shown in FIG. 12C. This defect image may be acquired by the irradiation of an electron beam in response to an instruction for display. Alternatively, a stored image, if there is one, may be displayed. If the operator determines that the defect 175 displayed on the screen 92 of FIG. 12C is a non-electrical defect, the operator refers back to FIG. 12A where he or she repeats a similar determination for another defect 173. The operator thus carries out such a determination a plurality of times for the defects 173 and 174 indicated by squares on the distribution chart. If the operator confirms that the results are of the same type of defect as those in a group of which the type has already been identified, he or she can incorporate the plurality of defects 173 and 174 indicated by squares into that group in step 156 of FIG. 11.

With regard to the modification of the region 81 shown in FIG. 12B, the operator may change the size of the region by dragging it on the screen 91. Alternatively, the region 81 may be caused to be automatically modified to include a square defect upon designation thereof by clicking. In step 157 of FIG. 11, it is determined whether or not the modification in the region 81 should be stored in the recipe. As shown in FIG. 12B, as the regions 81 and 83 are modified, the defect classification condition is automatically modified, as will be described in detail with reference to FIG. 13 later. This automatic classification is carried out in the defect confirmation control unit 602 of the host computer 59 shown in FIG. 1.

Figure 13:
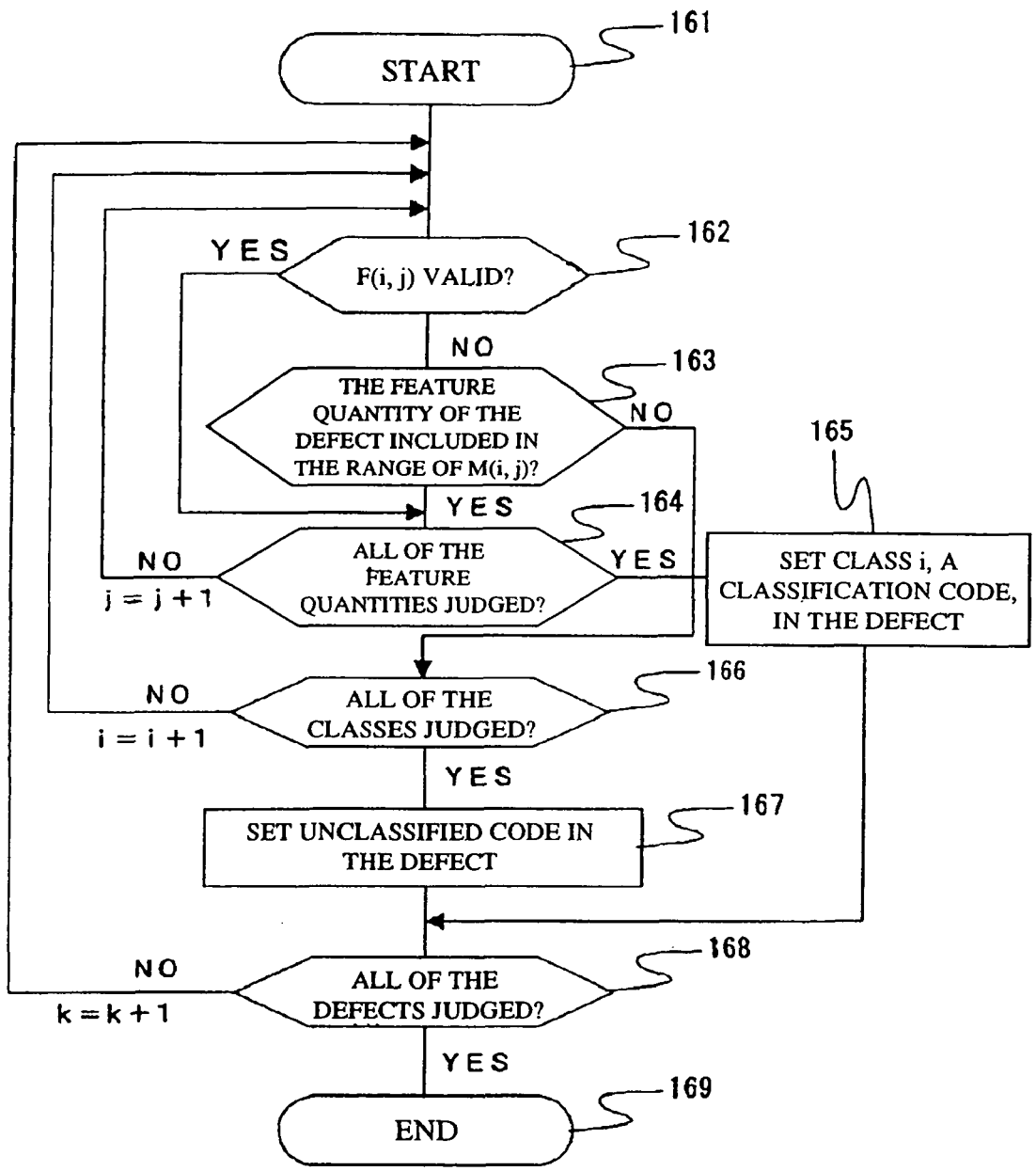
FIG. 13 shows a flowchart of an example of the method of automatically classifying defects.

FIG. 13 shows a flowchart of an example of the method of automatically classifying defects. As the regions 81 and 83 are modified as shown in FIG. 12B, an automatic classification process is initiated in step 161 of FIG. 13 on the defects 173 and 174, which do not belong to any of the regions shown in FIG. 12A. When the class, which is an attribute, of the defect 173 is defined as i and the differentiated value and the value of halftone difference are defined as a feature quantity j, for example, it is determined in step 162 whether the class i of a defect F (i, j) is valid or invalid. Since the defect 173 has been newly extracted as a result of inspection and has not yet been identified and classified, the class i is determined to be invalid, and the routine then proceeds to step 163.

In step 163, it is determined whether or not the differentiated value in the feature quantities j of the defect 173, for example, is included within the range of the differentiated value of the feature quantity j of a classification condition M (i, j) defining the region 81 shown in FIG. 12B. If the differentiated value is included, it is determined in step 164 that the halftone difference in the feature quantity j is unidentified. The routine then returns to step 162, and in step 163, it is determined whether the halftone difference is included in the range of the halftone difference, which is a feature quantity j+1 of the classification condition M (i, j), in the same manner as for the differentiated value.

If it is determined in step 164 that all of the determinations concerning the feature quantity j have been made, the routine proceeds to step 165, where a classification code indicating a non-electrical defect is set for the class i of the defect F (i, j).

A valid decision is made in step 162 when, for example, a classification code has already been set for i in F(i, j), such as in the case of the defect 171. In that case, there is no need to newly make a judgment on the classification condition M (i, j), and it is only necessary to determine in step 164 whether or not the classification condition M (i, j) has been judged as to all of the feature quantities j.

If one of the feature quantities j is not included in the range of the classification condition M (i, j) in step 163, the defect should be classified into a different class from that of the intended class i. Thus, in this case, decisions similar to those for the class i are made for another class i+1 from step 166. This process is repeated, and a defect that does not belong to the range of the classification condition M (i, j) of any class i is allocated an unclassified code in step 167, the code indicating that the defect does not belong to any class i.

It is then determined in step 168 whether or not the above process has been carried out on all of the defects, and the automatic classification process is completed in step 169.

In the above-described present embodiment, the class of a particular defect is determined and then a classification code is set for that defect, followed by the identification of a second defect and the setting of a classification code therefore. However, in cases where a defect corresponds to a plurality of classification codes, a priority order of classification may be determined in advance so that the defect can be classified into a class to which the defect is initially corresponded. Alternatively, a method may be adopted such that the defect is classified into all of the classes to which it corresponds and all of the corresponding classes are set.

Figure 14:
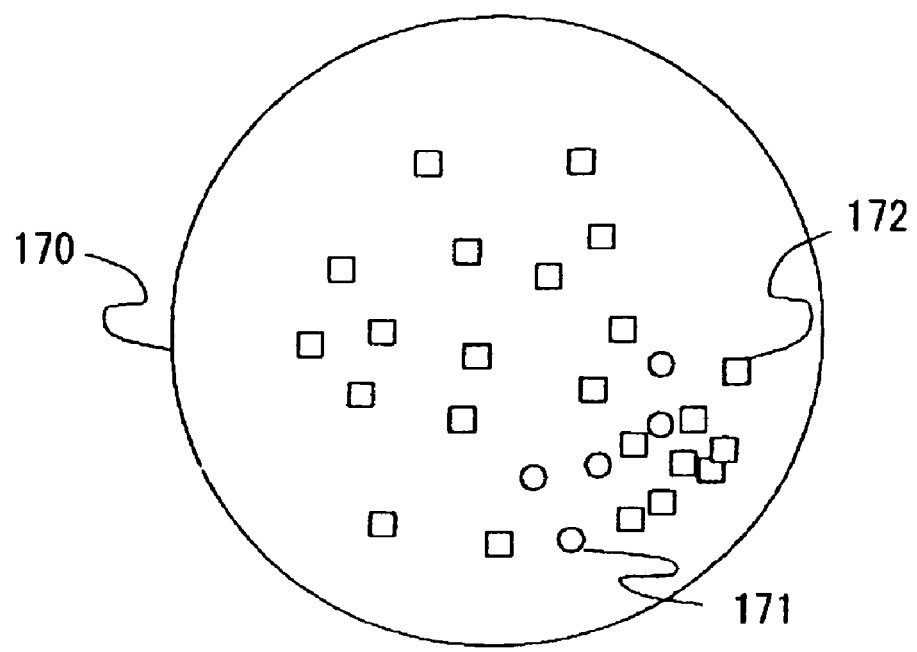
FIG. 14 shows a monitor screen displaying a distribution of defects in a semiconductor wafer.
Figure 15:
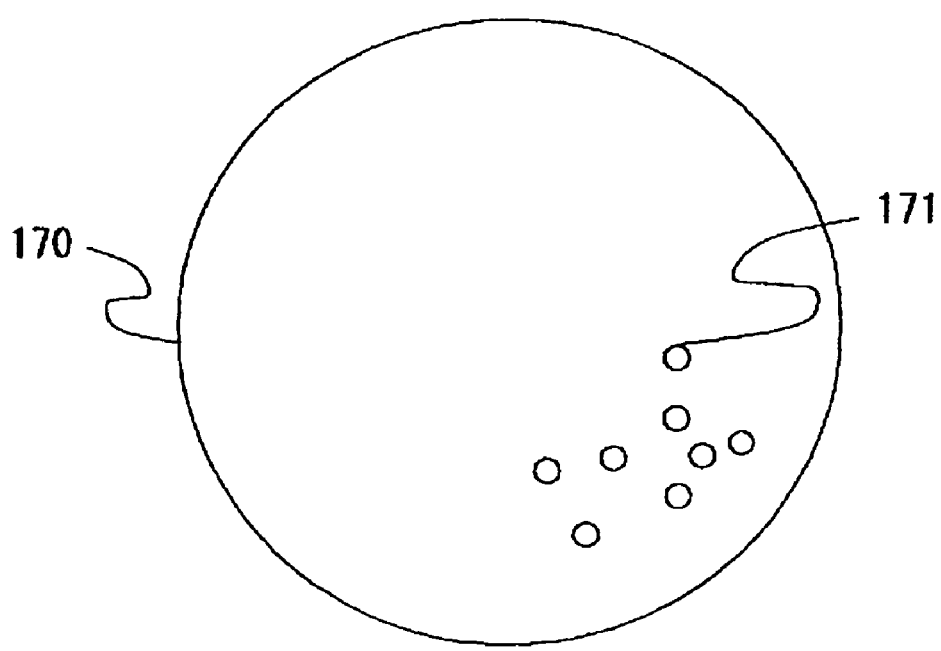
FIG. 15 shows a monitor screen displaying a distribution of defects in a semiconductor wafer.

FIGS. 14 and 15 show the distributions of defects in a semiconductor wafer displayed on the monitor. FIG. 14 shows an example where the non-electrical defects 171 indicated by circles and the foreign matter 172 indicated by squares are mixed on the wafer map 170. In an actual screen, however, they are not distinguished and so they appear to be similar defects, as this is prior to the classification of defects. In this case, the defects cannot be separated based on the coordinates X and Y as feature quantities of the defects.

Thus, as described with reference to FIG. 10, the defects are displayed in a distribution chart that is created by selecting the halftone difference and the differentiated value of halftone values as the feature quantities of defects. As a result, the non-electrical defects can be separated from foreign matter according to the magnitude of the halftone differences. Then, as the operator makes a designation such that group 3 of foreign matter shown in FIG. 10B is eliminated, there remains only group 1 of non-electrical defects. In this manner, only the non-electrical defects 171 can be displayed on the wafer map 170, as shown in FIG. 15.

Figure 16:
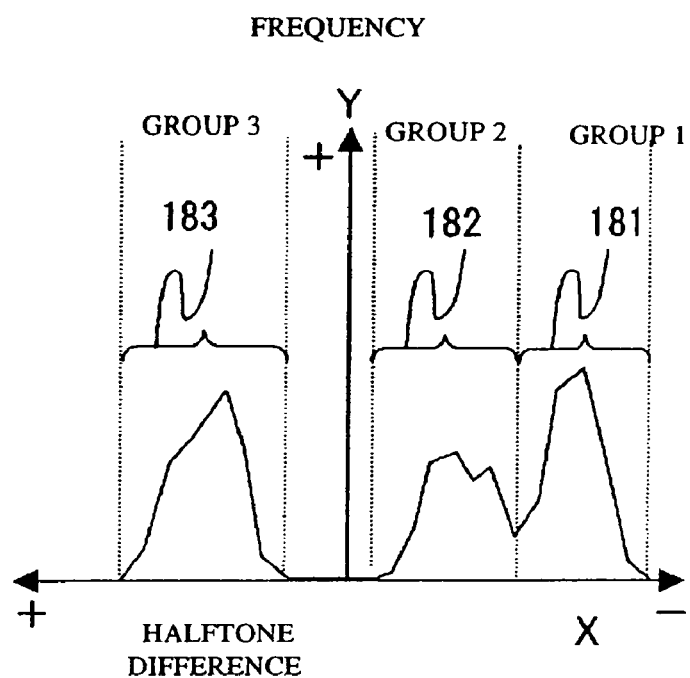
FIG. 16 shows a screen displaying an example of the distribution chart with a modified feature quantity.
Figure 17:
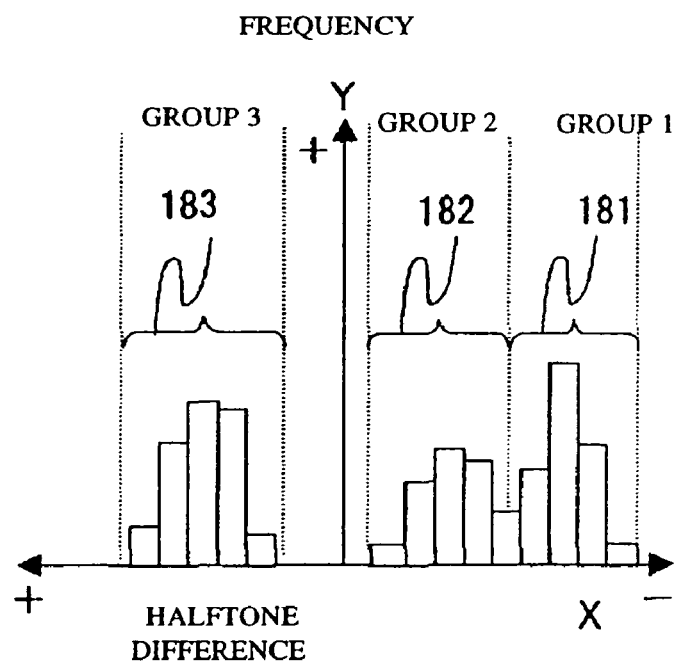
FIG. 17 shows a screen displaying an example of the distribution chart with a modified feature quantity.

FIGS. 16 and 17 show examples of distribution charts where the feature quantities are varied. In FIG. 16, the X-axis indicates the halftone difference, and the Y-axis indicates frequency, thus showing a histogram of defects. Frequency herein refers to the number of defects. The non-electrical defect and foreign matter can be also distinguished by plotting the frequency as a feature quantity of defects on the Y-axis. The region 181 of group 1 and the region 182 of group 2 that are considered to contain non-electrical defects are indicated by individual crests. The region 183 of group 3 considered to contain foreign matter can be distinguished from the regions 181 and 182.

FIG. 17 shows an example where the histogram of FIG. 16 is displayed in terms of a bar graph. In this case too, the region 181 of group 1 and the region 182 of group 2, both of non-electrical defects, are sufficiently indicated by individual crests, and the region 183 of group 3 of foreign matter can be distinguished from the regions 181 and 182.

However, the defects in group 3 are not necessarily all foreign matter. As mentioned above, the white circle defects with positive halftone differences displayed to the left of the Y-axis in the distribution chart include short-circuit defects in the VC defects, as well as foreign matter. Thus, in case that the extracted defects are considered to include a mixture of the three types of defects, namely the non-electrical defects, short-circuit defects and foreign matter, the white-circle defects and the non-electrical defects can be distinguished in the distribution chart of FIG. 16 or 17.

Figure 18:
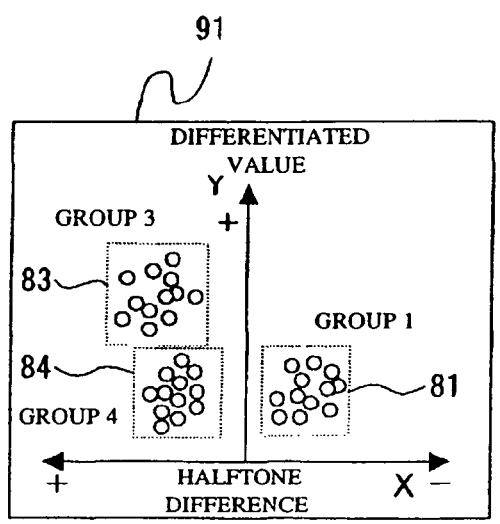
FIG. 18 shows screens displaying an example of the procedure of identifying defects in the step of setting the defect automatic classification condition.
Figure 18:
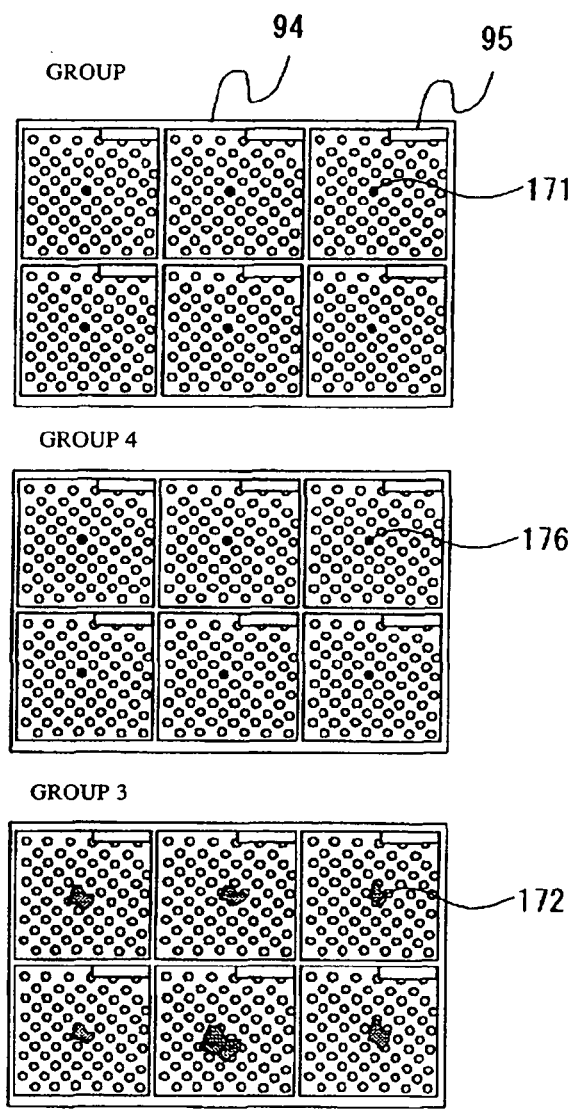

FIG. 18 shows a screen illustrating an example of the procedure of identifying defects in the step of setting the defect automatic classification condition, where the distribution chart shows the extracted defects containing a mixture of the three types of non-electrical defects, short-circuit defects and foreign matter. The Y-axis indicates the differentiated values of halftone values, instead of frequency. As described above, because foreign matter has a larger differentiated value than a short-circuit defect, group 3 of foreign matter and group 4 of short-circuit defects are shown in the screen 91 of FIG. 18A as white-circle defects separately along the Y-axis. On the other hand, the non-electrical defects are shown as black-circle defects on the side of the negative halftone differences (to the right-hand side of the chart). Thus, the three types of the defects can be distinguished in separated groups. FIG. 18B shows inspection images of the three types of defects, with each image indicating an ID such as the coordinates of the defect or its number, on the upper right-hand corner. On the screen 94, the defects of group 1 are displayed as black circles and can therefore be identified as the non-electrical defects 171. The defects in group 4 are indicated in gray with a white surrounding area for the sake of description. In an actual image, however, the defects are indicated as white circles and the surrounding area appear darker than the white shown. These defects can be identified as the short-circuit defects 176, as the inside of the contact hole is whiter than the surrounding area. The defects in group 3 are indicated in gray and the surrounding area is indicated in white for the sake of description, as in group 4. However, in an actual screen, the defects are indicated as white circles and the surrounding area appear darker than the white circles. These defects, which are white objects with irregular shapes that have nothing to do with the arrangement of the holes, can be identified as the foreign matter 172.

Thus, the operator, after identifying the defects in inspection images, can classify the defects into three groups by dividing the defects into individual groups on the distribution chart of FIG. 18A and then designating each region.

Figure 19:
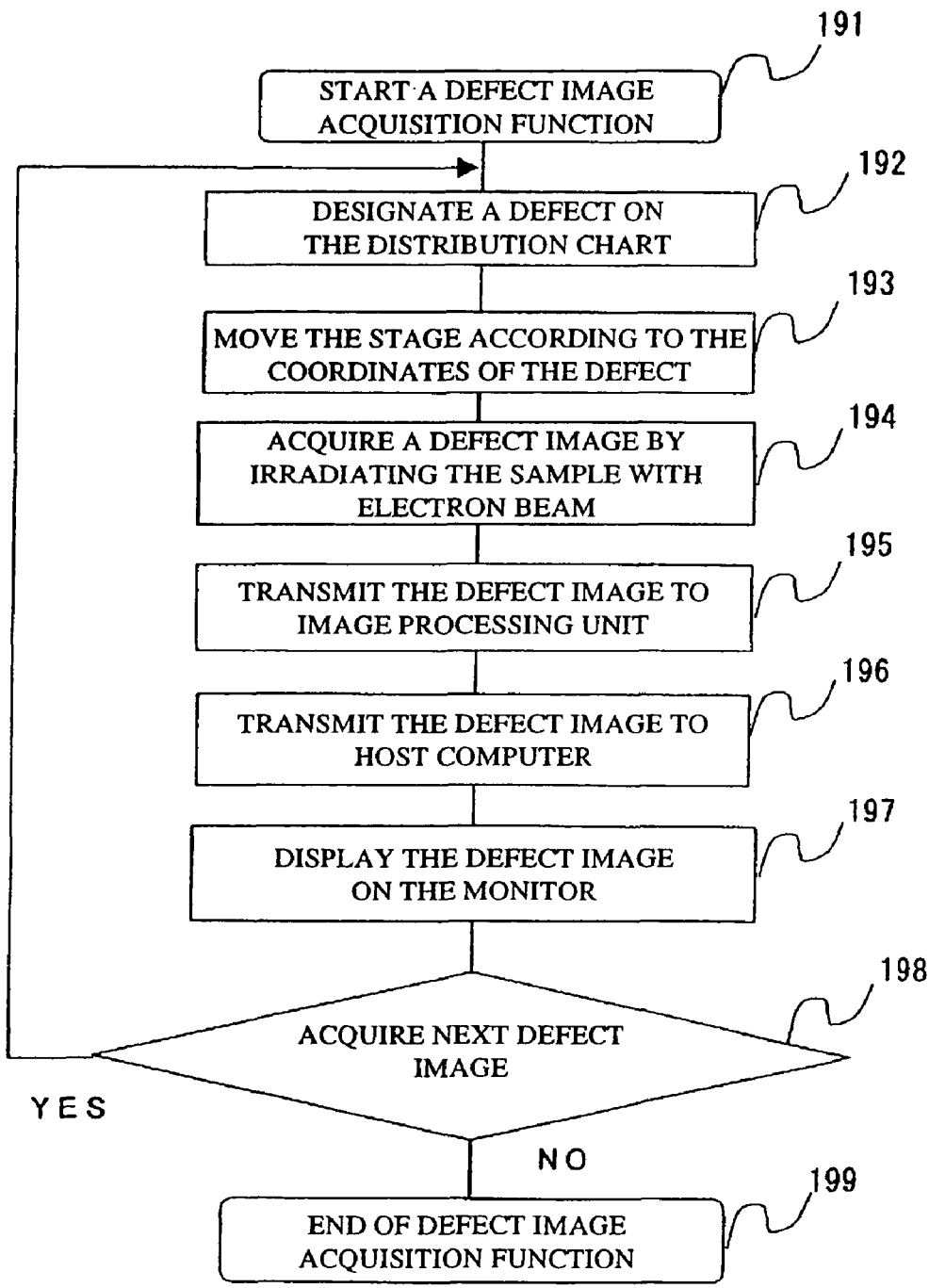
FIG. 19 shows a flowchart of the operation of the apparatus during the identification of defects in the step of setting the defect automatic classification condition.

FIG. 19 shows a flowchart of the operation of the SEM main unit 60 during the identification of defects in step 145 of the process of setting the defect automatic classification condition shown in FIG. 5.

In step 191, the defect image acquisition function is activated. In step 192, the operator designates a defect on the distribution chart for which the operator desires to acquire a defect image. Then, in step 193, the sample transfer stage 56 is driven by the function of the defect identification control unit 602 of the host computer 59 shown in FIG. 1, on the basis of the information about the coordinates X and Y of the designated defect, such that the sample 61 is moved to a position where the defect can be irradiated with the electron beam 71. Next, in step 194, the sample 61 is irradiated with the electron beam 71 and then the secondary electrons 72 are detected, thereby acquiring a defect image, which is an electron beam irradiation image of the defect. The procedure for acquiring the image is the same as that described with reference to FIG. 1 and therefore will not be described herein. In step 195, the defect image is sent to the image processing unit 58. In step 196, the defect image is sent from the chip memory 502 to the host computer 59 via the system bus 511, and it is displayed on the monitor 63 in step 197. The defect image from the chip memory 502 may be stored in a memory (not shown), so that it can be displayed on the monitor 63 later when necessary, without the electron beam irradiation for acquiring the image.

In step 198, the operator determines whether or not another defect image should be acquired. If another defect image is to be acquired, the routine returns to step 192 to repeat the process until all of the desired defect images are acquired, whereupon the routine is terminated in step 199.

Thus, by selecting the halftone difference as a feature quantity on the X-axis of the distribution chart, the non-electrical defects and foreign matter can be clearly distinguished. Accordingly, in accordance with the present embodiment, automatic classification can be carried out using a feature quantity other than the coordinates X and Y.

As described above, the defects can be automatically classified by determining the feature quantities of the defects and then creating a distribution chart of the feature quantities.

Further, as the recipe can be modified in terms of the defect automatic classification condition in accordance with the inspection results, an increasingly optimal automatic classification condition can be found by repeating the inspection.

In addition, as only a defect of which the content is desired to be known can be efficiently extracted from many types of defects, only the defect of interest can be analyzed in detail. Thus, the time it takes before the cause of a defect can be clarified by defect analysis after the extraction of the defect by inspection can be reduced, for example. As a result, efficient defect inspection and analysis can be conducted.

In accordance with the invention, an inspection method and apparatus are provided that are capable of extracting a desired defect from many defects that have been extracted during inspection, using an electron beam.

What is claimed is:

1. An inspection method using an electron beam comprising the steps of:
   irradiating a sample on which a pattern is formed with an electron beam;
   generating an inspection image and a reference image based on a secondary electron or a reflected electron emitted by the sample;

determining an abnormal pattern based on a difference in the halftone values of each pixel between the inspection image and reference image;

determining a plurality of feature quantities of the abnormal pattern wherein the feature quantities include the sum of halftone differences of each pixel determined on the basis of the inspection image and reference image of the abnormal pattern, and the sum of absolute values of the differentiated values of halftone values between each pair of adjacent pixels determined on the basis of the inspection image including the abnormal pattern;

arranging the plurality of feature quantities of the abnormal pattern on a distribution chart created from the feature quantities of the abnormal pattern, the distribution chart including axes to which the sum of halftone differences of each pixel and the sum of absolute values of the differentiated values of halftone values between each pair of adjacent pixels are assigned;

generating a plurality of groups of abnormal patterns in the distribution chart;

displaying on a screen the inspection image, the reference image and an abnormal pattern extraction image of the abnormal pattern of one of the plurality of groups together with the distribution chart; and designating a range for classifying the type of abnormal pattern based on the display on the screen in the step of displaying.

2. The inspection method according to claim 1, wherein the distribution chart is created after an inspection is carried out using a recipe for inspection including the designation of the range for classifying the abnormal pattern, and wherein a classification condition for automatically classifying the defect is modified on the distribution chart based on the feature quantities of the abnormal pattern detected by the inspection, the result of modification being stored in the recipe.

3. The inspection method according to claim 1, wherein the modification of the classifying condition for the automatic classification of the defect at least includes storing the content of designation including the range for classifying the type of the abnormal pattern designated on the distribution chart.

4. An inspection apparatus for irradiating a sample on which a pattern is formed with an electron beam, so that an inspection image and a reference image can be generated on the basis of a secondary electron or a reflected electron emitted by the sample, wherein an abnormal pattern is determined based on a difference in halftone values of each pixel between the inspection image and the reference image, the inspection apparatus comprising:

a feature-quantity calculating unit for determining a feature quantity of the abnormal pattern based on a difference image and the inspection image, the difference image being obtained from the difference in halftone values of each pixel between the inspection image and the reference image;

a classification calculating unit for classifying the abnormal pattern into a plurality of groups based on the distribution of the feature quantity; and a display unit for displaying on a screen the inspection image, the reference image and an abnormal pattern extraction image of the abnormal pattern of one of a plurality of groups together with a distribution chart, wherein the feature quantity includes the sum of halftone differences of each pixel determined on the basis of the inspection image and reference image of the abnormal pattern, and the sum of absolute values of the differentiated values of halftone values between each pair of adjacent pixels determined on the basis of the inspection image including the abnormal pattern, wherein the classification calculating unit arranges the plurality of feature quantities of the abnormal pattern on the distribution chart created from the feature quantities of the abnormal pattern, the distribution chart including axes to which the sum of halftone differences of each pixel and the sum of absolute values of the differentiated values of halftone values between each pair of adjacent pixels are assigned, wherein the classification calculating unit generates the plurality of groups of abnormal patterns in the distribution chart, and wherein the classification calculating unit designates a range for classifying the type of abnormal pattern based on the display on the screen.

5. The inspection apparatus according to claim 4, wherein the classification calculating unit, after an inspection is conducted during the process of preparing the recipe defining the content of inspection of the pattern, generates a distribution chart based on the feature quantity of the abnormal pattern detected during the inspection, and upon designation of a range classifying the type of the abnormal pattern in the distribution chart, stores the content of the designation in the recipe.

6. The inspection apparatus according to claim 5, wherein the classification calculating unit generates a distribution chart after an inspection is conducted using the recipe for inspection including the designation of the range for classifying the abnormal pattern, modifies the classification condition for the automatic classification of the defect on the distribution chart based on the feature quantity of the abnormal pattern that has been detected during the inspection, and stores the result of modification in the recipe.

7. The inspection apparatus according to claim 6, wherein the modification of the classification condition for the automatic classification of the defect at least includes a modification of the content of designation including the range for classifying the type of the abnormal pattern designated on the distribution chart.

8. The inspection method according to claim 1,
wherein the feature quantity includes a standardized value of the sum of halftone differences of each pixel determined on the basis of the inspection image and reference image of the abnormal pattern by the area of the abnormal pattern, a standardized value of the sum of absolute values of the differentiated values of halftone values between each pair of adjacent pixels determined on the basis of the inspection image including the abnormal pattern by the area of the abnormal pattern, instead of the sum of halftone differences of each pixel, and the sum of absolute values of the differentiated values of halftone values between each pair of adjacent pixels, and the distribution chart includes axes of which the standardized value of the sum of halftone differences and the standardized value of the sum of absolute values of the differentiated values of halftone values are assigned.

9. The inspection method according to claim 8,
wherein the standardized value is calculated by dividing the sum of halftone differences of each pixel and the sum of absolute values of the differentiated values of halftone values by the area of the abnormal pattern.

10. The inspection apparatus according to claim 4,
wherein the feature quantity includes a standardized value of the sum of halftone differences of each pixel determined on the basis of the inspection image and reference image of the abnormal pattern by the area of the abnormal pattern, a standardized value of the sum of absolute values of the differentiated values of halftone values between each pair of adjacent pixels determined on the basis of the inspection image including the abnormal pattern by the area of the abnormal pattern, instead of the sum of halftone differences of each pixel, and the sum the absolute values of the differentiated values of halftone values between each pair of adjacent pixels, and the distribution chart includes axes to which the standardized value of the sum of halftone differences and the standardized value of the sum of absolute values of the differentiated values of halftone values are assigned.

11. The inspection apparatus according to claim 10, wherein the standardized value is calculated by dividing the sum of halftone differences of each pixel and sum of absolute values of the differentiated values of halftone values by the area of the abnormal pattern.

* * * * *